(12) United States Patent
Mehrotra

(10) Patent No.: US 9,401,365 B2
(45) Date of Patent: Jul. 26, 2016

(54) EPITAXIAL SOURCE/DRAIN DIFFERENTIAL SPACERS

(71) Applicant: Texas Instruments Incorporated, Dallas, TX (US)

(72) Inventor: Manoj Mehrotra, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/559,300

(22) Filed: Dec. 3, 2014

(65) Prior Publication Data

US 2015/0179654 A1 Jun. 25, 2015

Related U.S. Application Data

(60) Provisional application No. 61/918,278, filed on Dec. 19, 2013.

(51) Int. Cl.
| | |
|---|---|
| *H01L 29/66* | (2006.01) |
| *H01L 27/11* | (2006.01) |
| *H01L 21/8238* | (2006.01) |
| *H01L 27/092* | (2006.01) |
| *H01L 21/265* | (2006.01) |
| *H01L 29/78* | (2006.01) |

(Continued)

(52) U.S. Cl.
CPC ...... *H01L 27/1104* (2013.01); *H01L 21/26513* (2013.01); *H01L 21/823807* (2013.01); *H01L 21/823814* (2013.01); *H01L 21/823864* (2013.01); *H01L 27/0922* (2013.01); *H01L 27/1116* (2013.01); *H01L 29/165* (2013.01); *H01L 29/6653* (2013.01); *H01L 29/6656* (2013.01); *H01L 29/66636* (2013.01); *H01L 29/7834* (2013.01); *H01L 29/7848* (2013.01); *H01L 21/266* (2013.01); *H01L 21/3086* (2013.01)

(58) Field of Classification Search
CPC ............ H01L 27/1104; H01L 27/1116; H01L 29/16008; H01L 29/161; H01L 21/266; H01L 27/0623; H01L 21/823814; H01L 21/823807; H01L 21/70; H01L 21/8238; H01L 29/6653; H01L 29/6656; H01L 29/66636; H01L 29/7834; H01L 21/823864; H01L 27/0922; H01L 21/26513
See application file for complete search history.

(56) References Cited

U.S. PATENT DOCUMENTS

| | | | | |
|---|---|---|---|---|
| 2003/0059983 A1* | 3/2003 | Ota | ................. | H01L 21/823814 438/128 |
| 2006/0226558 A1* | 10/2006 | Fukai | .............. | H01L 21/823864 438/142 |

(Continued)

*Primary Examiner* — Jarrett Stark
*Assistant Examiner* — Bitew Dinke
(74) *Attorney, Agent, or Firm* — Jacqueline J. Garner; Frank D. Cimino

(57) ABSTRACT

A process of forming an integrated circuit containing a first transistor and a second transistor of the same polarity, by forming an epitaxial spacer layer over gates of both transistors, performing an epitaxial spacer anisotropic etch process to form epitaxial spacers on vertical surfaces adjacent to the first transistor gate and removing the epitaxial spacer layer from the second transistor gate, subsequently performing a source/drain etch process and a source/drain epitaxial process to form source/drain epitaxial regions in the substrate adjacent to the first and second gates, such that the first source/drain epitaxial regions are separated from the first gate by a lateral space which is at least 2 nanometers larger than a second lateral space separating the second source/drain epitaxial regions from the second gate. An integrated circuit formed by the recited process.

19 Claims, 28 Drawing Sheets

(51) Int. Cl.
  *H01L 29/165*   (2006.01)
  *H01L 21/266*   (2006.01)
  *H01L 21/308*   (2006.01)

(56) References Cited

U.S. PATENT DOCUMENTS

| | | | | |
|---|---|---|---|---|
| 2006/0292783 | A1* | 12/2006 | Lee | H01L 21/823807 438/199 |
| 2007/0252205 | A1* | 11/2007 | Hoentschel | H01L 21/84 257/347 |
| 2008/0085577 | A1* | 4/2008 | Shih | H01L 21/823807 438/199 |
| 2008/0286928 | A1* | 11/2008 | Minami | H01L 21/823807 438/275 |
| 2011/0312145 | A1* | 12/2011 | Tsai | H01L 21/26586 438/300 |
| 2012/0012938 | A1* | 1/2012 | Chen | H01L 21/823807 257/369 |
| 2012/0056245 | A1* | 3/2012 | Kang | H01L 21/0245 257/192 |
| 2012/0258576 | A1* | 10/2012 | Kanno | H01L 21/823418 438/231 |
| 2014/0011340 | A1* | 1/2014 | Song | H01L 29/6653 438/478 |
| 2014/0099767 | A1* | 4/2014 | Maekawa | H01L 29/66477 438/305 |
| 2014/0141589 | A1* | 5/2014 | Shin | H01L 29/66568 438/306 |
| 2014/0273370 | A1* | 9/2014 | Gerhardt | H01L 21/8238 438/232 |
| 2015/0031177 | A1* | 1/2015 | Riley | H01L 21/823807 438/199 |

* cited by examiner

US 9,401,365 B2

EPITAXIAL SOURCE/DRAIN DIFFERENTIAL SPACERS

CROSS-REFERENCE TO RELATED APPLICATIONS

This application claims the benefit of priority under U.S.C. §119(e) of U.S. Provisional Application 61/918,278, filed Dec. 19, 2013, which is hereby incorporated by reference in its entirety.

FIELD OF THE INVENTION

This invention relates to the field of integrated circuits. More particularly, this invention relates to epitaxial source/drain layers in integrated circuits.

BACKGROUND OF THE INVENTION

Epitaxial layers may be used to enhance performance of transistors of a given polarity in an integrated circuit. For example, silicon-germanium epitaxial source/drain layers may be used to increase on-state currents in p-channel metal oxide semiconductor (PMOS) transistors. Similarly, silicon carbide epitaxial source/drain layers may be used to increase on-state currents in n-channel metal oxide semiconductor (NMOS) transistors. It may be desirable to achieve a differential enhancement between two types of transistors of the same polarity in an integrated circuit. For example, it may be desirable to achieve higher on-state current in transistors in logic gates compared to transistors in static random access memory (SRAM) circuits. Attaining desired levels of differential performance between types of transistors of the same polarity having epitaxial source/drain layers without increasing fabrication cost and/or complexity has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed so as to provide transistors of a certain polarity having source/drain epitaxial layers in which a first transistor has a lateral space between a gate and the source/drain epitaxial layers that is greater than a corresponding lateral space in a second transistor, by at least 2 nanometers. The transistors are formed by forming a conformal epitaxial spacer layer over the gates of the transistors, anisotropically etching the epitaxial spacer layer on the first transistor gate so as to leave epitaxial spacers adjacent to the first gate, and removing the epitaxial spacer layer on the second transistor gate so that the second gate is substantially free of epitaxial spacer material. Subsequent etching of the source/drain areas with the epitaxial spacer on the first gate and epitaxial growth results in a greater space between the first transistor gate and the epitaxial layer than in the second transistor. The difference in spaces between the gates and the source/drain epitaxial layers may provide a desired differential in performance without adding a photolithographic operation to the fabrication sequence of the integrated circuit.

DETAILED DESCRIPTION OF EXAMPLE EMBODIMENTS

Figure 1A:
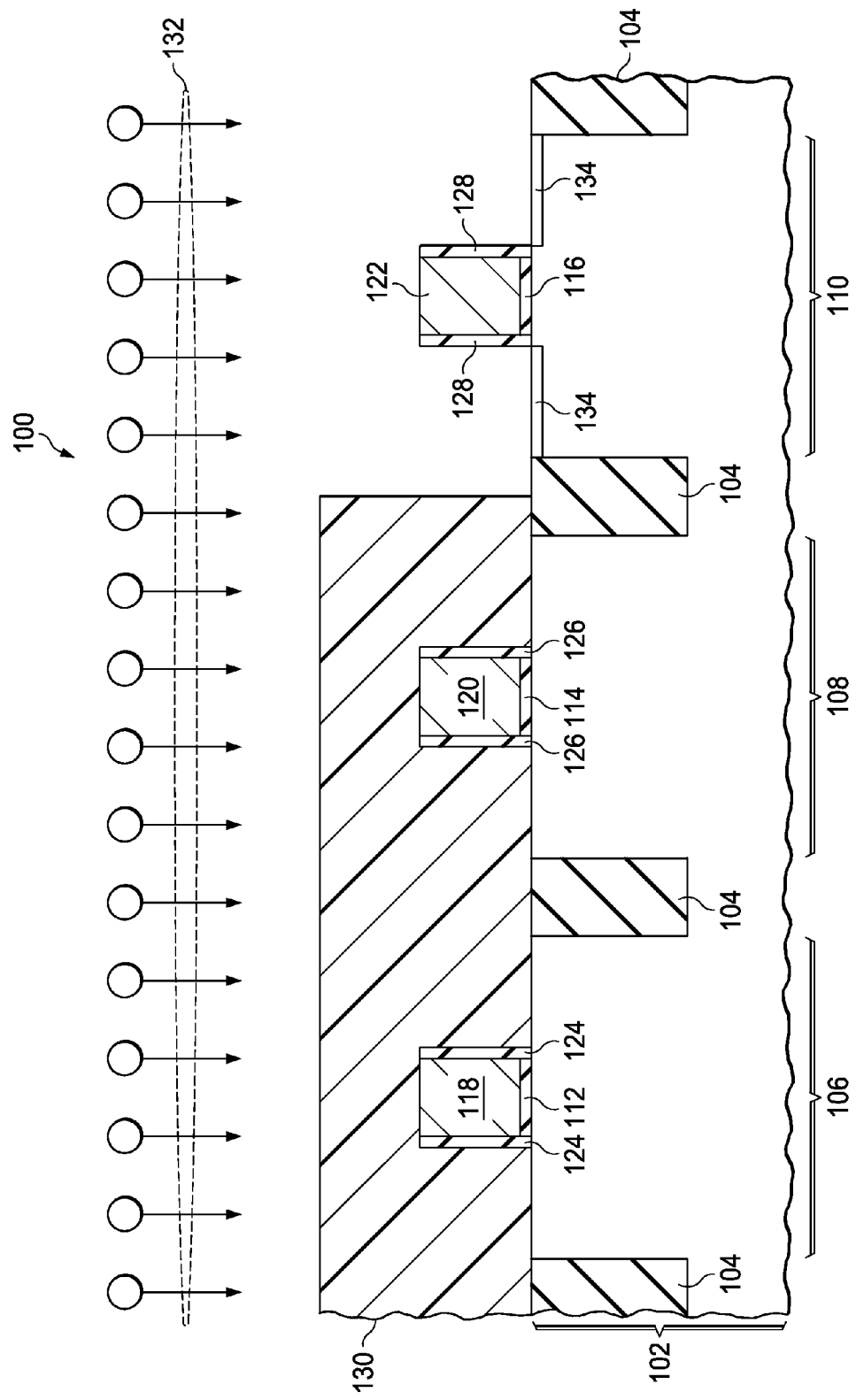
FIG. 1A through FIG. 1L are cross sections of an integrated circuit containing two transistors of a same polarity with epitaxial source/drain layers formed according to an example, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may be formed so as to provide transistors of a certain polarity having source/drain epitaxial layers in which a first transistor has a lateral space between a gate and the source/drain epitaxial layers that is greater than a corresponding lateral space in a second transistor, by at least 2 nanometers. The transistors are formed by a process including forming a conformal epitaxial spacer layer over gates of the transistors, anisotropically etching the epitaxial spacer layer on the gate of the first transistor so as to leave epitaxial spacers adjacent to the first gate, and removing the epitaxial spacer layer on the gate of the second transistor so that the second gate is substantially free of epitaxial spacer material. Subsequent etching of source/drain areas of the transistors and epitaxial growth in the etched areas results in a greater space between the first transistor gate and the epitaxial source/drain layer than in the second transistor. The difference in spaces between the gates and the source/drain epitaxial layers may provide a desired differential in performance without adding a photolithographic operation to the fabrication sequence of the integrated circuit.

For the purposes of this description, the term "substantially" as applied to structures and elements formed in an integrated circuit is understood to mean within fabrication tolerances used to fabricate the integrated circuit. For example, a process which provides a structure which is "substantially free of" an element is understood to mean the process removes all of the element from the structure, except possibly insignificant amounts, such as monolayer residues or residual element material in corners or crevices of the structure. Relationships between transistor polarity and conductivity type will be preserved throughout this description. Transistors of a first polarity type will have lightly doped drain (LDD) regions of a first conductivity type, and transistors of a second polarity opposite from the first polarity will have LDD regions of a second conductivity type opposite from the first conductivity type. For example, an n-channel polarity transistor will have n-type LDD regions and a p-channel polarity transistor will have p-type LDD regions.

FIG. 1A through FIG. 1L are cross sections of an integrated circuit containing two transistors of a same polarity with epitaxial source/drain layers formed according to an example, depicted in successive stages of fabrication. Referring to FIG. 1A, the integrated circuit 100 is formed in an on a semiconductor substrate 102, which may be a single crystal silicon wafer, a silicon-on-insulator (SOI) wafer, a hybrid orientation technology (HOT) wafer with regions of different crystal orientations, or other semiconductor material appropriate for fabrication of the integrated circuit 100. Elements of field oxide 104 may be formed at a top surface of the substrate 102, typically of silicon dioxide between 250 and 600 nanometers thick, commonly by shallow trench isolation (STI) or local oxidation of silicon (LOCOS) processes. In STI processes, silicon dioxide may be deposited by high density plasma (HDP) or high aspect ratio process (HARP).

The integrated circuit 100 includes a first area defined for a first transistor 106 having the first polarity, a second area defined for a second transistor 108 having the first polarity, and a third area defined for a third transistor 110 having the second polarity. In one version of the instant example, the first polarity may be p-channel and the second polarity may be n-channel. In another version, the first polarity may be n-channel and the second polarity may be p-channel. The transistor areas 106, 108 and 110 may be separated by field oxide 104 as depicted in FIG. 1A.

A first gate dielectric layer 112 is formed on the substrate 102 in the area for the first transistor 106, a second gate dielectric layer 114 is formed on the substrate 102 in the area for the second transistor 108, and a third gate dielectric layer 116 is formed on the substrate 102 in the area for the third transistor 110. The gate dielectric layers 112, 114 and 116 may be one or more layers of silicon dioxide, silicon oxynitride, aluminum oxide, aluminum oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The gate dielectric layers 112, 114 and 116 may include nitrogen as a result of exposure to a nitrogen containing plasma or a nitrogen-containing ambient gas at temperatures between 50 C and 800 C. The gate dielectric layers 112, 114 and 116 may be between 1 and 4 nanometers thick. The gate dielectric layers 112, 114 and 116 may be formed by any of a variety of gate dielectric formation processes, for example thermal oxidation, plasma nitridation of an oxide layer, and/or dielectric material deposition by atomic layer deposition (ALD). In one version of the instant example, the first gate dielectric layer 112 and the second gate dielectric layer 114 may be formed concurrently. In another version, all three gate dielectric layers 112, 114 and 116 may be formed concurrently.

A first gate 118 is formed on the first gate dielectric layer 112, a second gate 120 is formed on the second gate dielectric layer 114, and a third gate 122 is formed on the third gate dielectric layer 116. In one version of the instant example, the gates 118, 120 and 122 may be formed, for example by depositing a layer of polycrystalline silicon, commonly referred to as polysilicon, on the gate dielectric layers 112, 114 and 116, followed by forming a gate etch mask, not shown, on the polysilicon layer and removing unwanted polysilicon so as to leave the gates 118, 120 and 122. In another version, the gates 118, 120 and 122 may include titanium nitride or other metal alloy. Instances of the gates 118, 120 and 122 which include another material and/or formed by another process are within the scope of the instant example. The gates 118, 120 and 122 may further include dielectric layers, not shown, at top surfaces of the gates 118, 120 and 122. The gates 118, 120 and 122 may be, for example, less than 50 nanometers long, in a direction parallel to current flow in channel regions under the gate dielectric layers 112, 114 and 116, respectively.

Optional first gate offset spacers 124 may be formed on lateral surfaces of the first gate 118, optional second gate offset spacers 126 may be formed on lateral surfaces of the second gate 120, and/or optional third gate offset spacers 128 may be formed on lateral surfaces of the third gate 122. The optional gate offset spacers 124, 126 and/or 128, if present, may include one or more layers of silicon dioxide, silicon nitride, silicon oxynitride and/or polysilicon. The optional gate offset spacers 124, 126 and/or 128 may be formed, for example by oxidizing the gates 118, 120 and 122 so as to form a thin layer of silicon dioxide on exposed surfaces of the gates 118, 120 and 122, followed by depositing conformal layers of sidewall material including silicon dioxide, silicon nitride, silicon oxynitride and/or polysilicon over the gates 118, 120 and 122 and substrate 102, and performing an anisotropic etch which removes the sidewall material from horizontal surfaces of the gates 118, 120 and 122 and substrate 102, leaving the gate offset spacers 124, 126 and/or 128. The gate offset spacers 124, 126 and 128 may be, for example between 1 and 10 nanometers thick. In one version of the instant example, the first gate offset spacers 124 and the second gate offset spacers 126 may be formed concurrently. In another version, all three gate offset spacers 124, 126 and 128 may be formed concurrently.

A third transistor LDD implant mask 130 is formed over the area for the first transistor 106 and the area for the second transistor 108 so as to expose the area for the third transistor 110. The third transistor LDD implant mask 130 may include photoresist and be formed using a photolithographic process. A third transistor LDD ion implant process is performed which implants third transistor LDD dopants 132 into the substrate 102 adjacent to the third gate 122 to form third transistor LDD implanted regions 134 of the second conductivity type. For example, if the third transistor polarity is n-channel, the third transistor LDD implanted regions 134 are n-type. Conversely, if the third transistor polarity is p-channel, the third transistor LDD implanted regions 134 are p-type. The third transistor LDD dopants 132 may have a dose, for example, between $1 \times 10^{13}$ cm$^{-2}$ and $5 \times 10^{14}$ cm$^{-2}$. The third transistor LDD implant mask 130 is removed after the third transistor LDD ion implant process is completed, for example by exposing the integrated circuit 100 to an oxygen containing plasma, followed by a wet cleanup to remove any organic residue.

Figure 1B:
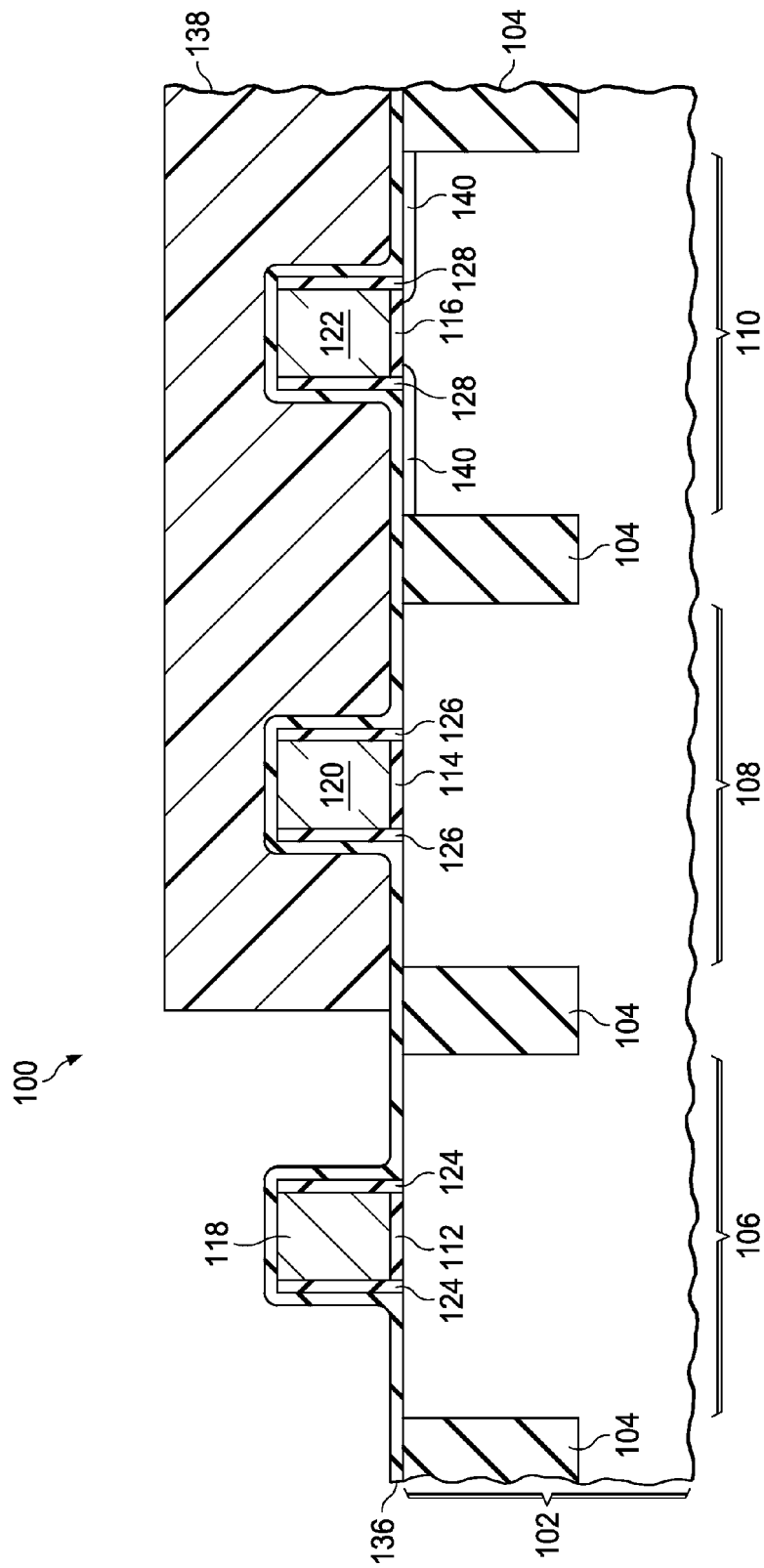

Referring to FIG. 1B, a conformal epitaxial spacer layer 136 is formed over the integrated circuit 100. The epitaxial spacer layer 136 may be for example, between 2 and 5 nanometers thick on vertical surfaces adjacent to the first gate 118. The epitaxial spacer layer 136 may include, for example, one or more layers of silicon dioxide, silicon nitride, silicon oxynitride, and/or polysilicon. The epitaxial spacer layer 136 may be formed, for example, by chemical vapor deposition (CVD), plasma enhanced chemical vapor deposition (PECVD), ALD, decomposition of tetraethyl orthosilicate, also known as tetraethoxysilane or TEOS, and/or decomposition of bis (tertiary-butylamino) silane (BTBAS).

A first transistor LDD implant mask 138 is formed over the area for the second transistor 108 and the area for the third transistor 110 so as to expose the area for the first transistor 106. The first transistor LDD implant mask 138 may be formed in a similar manner to the third transistor LDD implant mask 130 of FIG. 1A.

An anneal operation activates dopants in the third transistor LDD implanted regions 134 to form third transistor LDD regions 140. The anneal operation may be performed prior to, or subsequent to, formation of the epitaxial spacer layer 136. In one version of the instant example, the dopants in the third transistor LDD implanted regions 134 may be activated concurrently with dopants in other implanted regions.

Figure 1C:
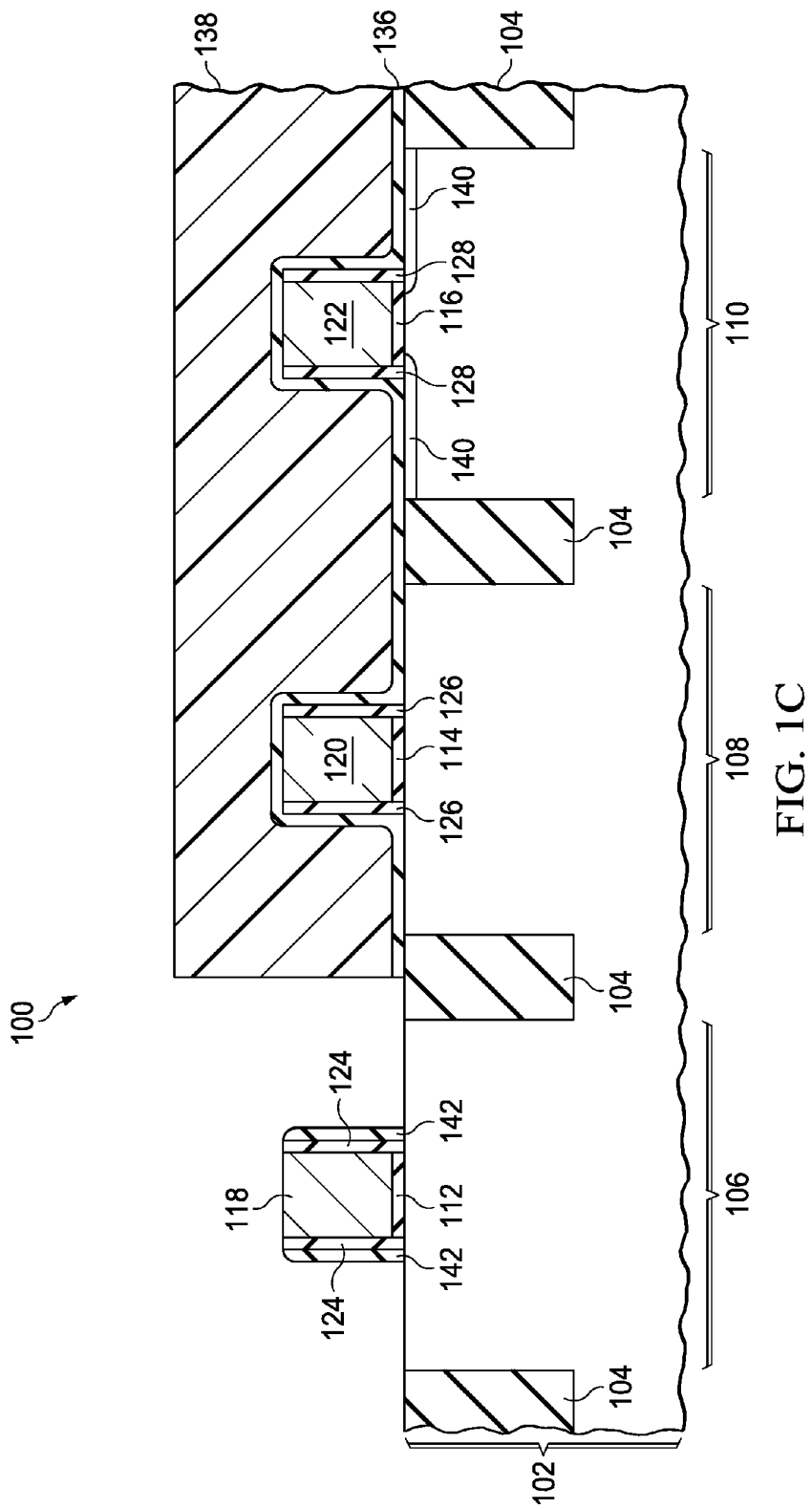

Referring to FIG. 1C, an epitaxial spacer anisotropic etch process is performed which removes material of the epitaxial spacer layer 136 from horizontal surfaces on the substrate 102 and first gate 118 so as to leave epitaxial spacers 142 adjacent to the first gate 118; on vertical surfaces of the first gate offset spacers 124 if present, or on vertical surfaces of the first gate 118 if the first gate offset spacers 124 are not present. In one version of the instant example, the epitaxial spacers 142 may be between 2 and 5 nanometers thick. The epitaxial spacer anisotropic etch process may be, for example, a reactive ion etch (RIE) process using a plasma containing fluorine radicals.

Figure 1D:
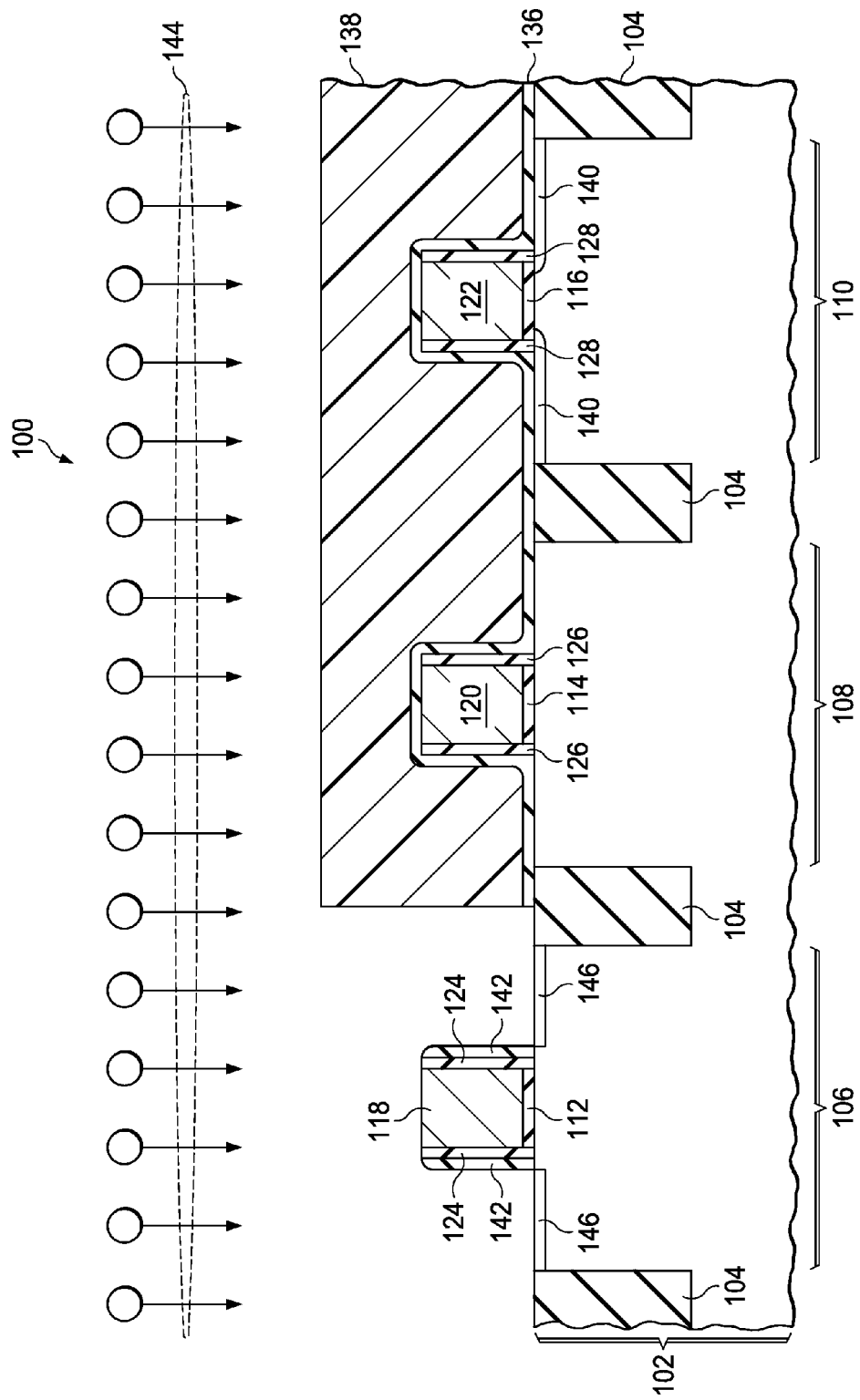

Referring to FIG. 1D, a first transistor LDD ion implant process is performed which implants first transistor LDD dopants 144 into the substrate 102 adjacent to the first gate 118 to form first transistor LDD implanted regions 146 of the first conductivity type. For example, if the first transistor polarity is p-channel, the first transistor LDD implanted regions 146 are p-type. Conversely, if the first transistor polarity is n-channel, the first transistor LDD implanted regions 146 are n-type. The first transistor LDD dopants 144 may have a dose, for example, between $1\times10^{13}$ cm$^{-2}$ and $5\times10^{14}$ cm$^{-2}$. The first transistor LDD implant mask 138 is removed after the first transistor LDD ion implant process is completed, for example as described in reference to the third transistor LDD implant mask 130.

Figure 1E:
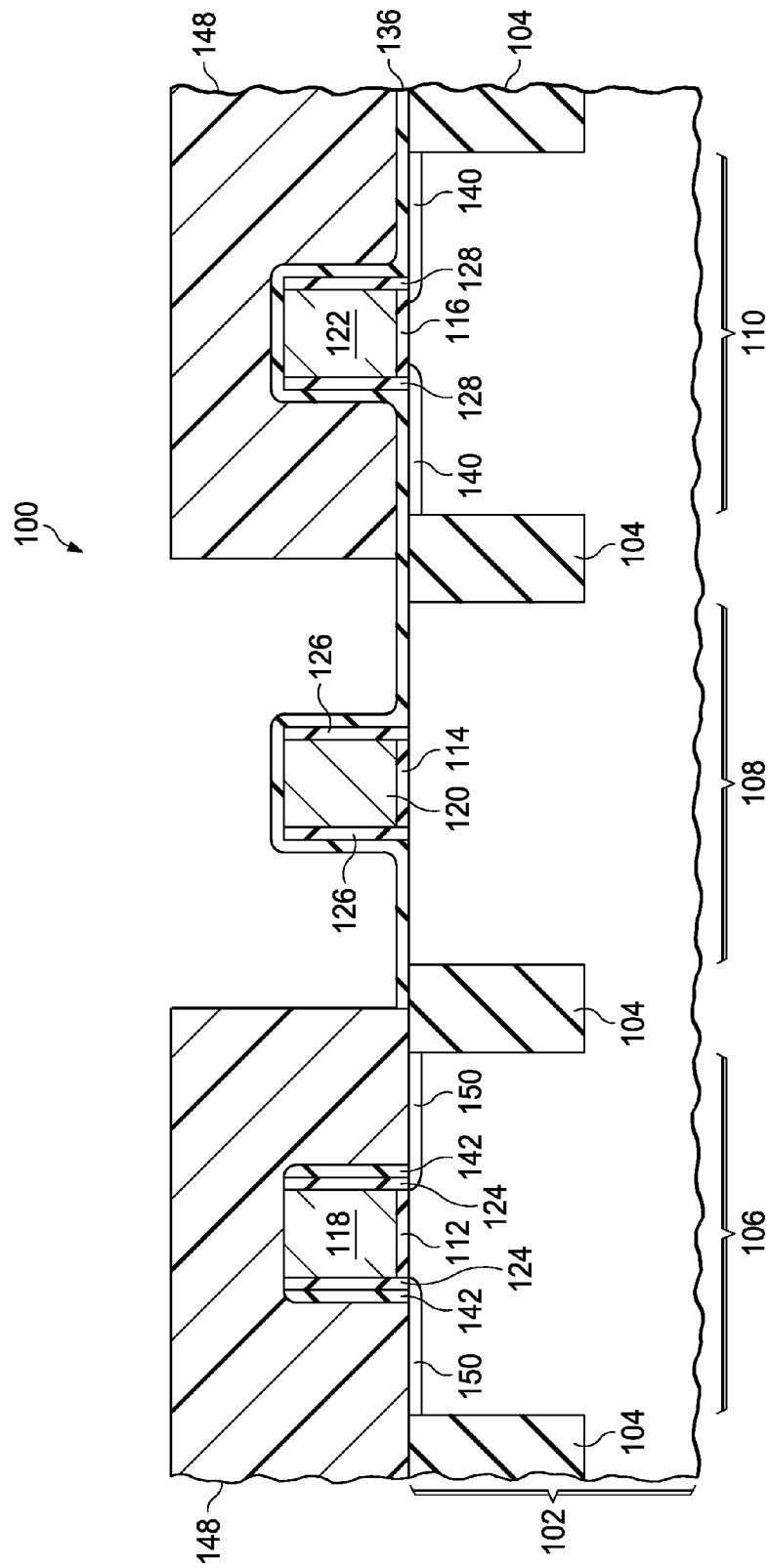

Referring to FIG. 1E, a second transistor LDD implant mask 148 is formed over the area for the first transistor 106 and the area for the third transistor 110 so as to expose the area for the second transistor 108. The second transistor LDD implant mask 148 may be formed in a similar manner to the third transistor LDD implant mask 130 of FIG. 1A.

An anneal operation activates dopants in the first transistor LDD implanted regions 146 to form first transistor LDD regions 150. The anneal operation may be performed prior to, or subsequent to, formation of the second transistor LDD implant mask 148. In one version of the instant example, the dopants in the first transistor LDD implanted regions 146 may be activated concurrently with dopants in other implanted regions.

Figure 1F:
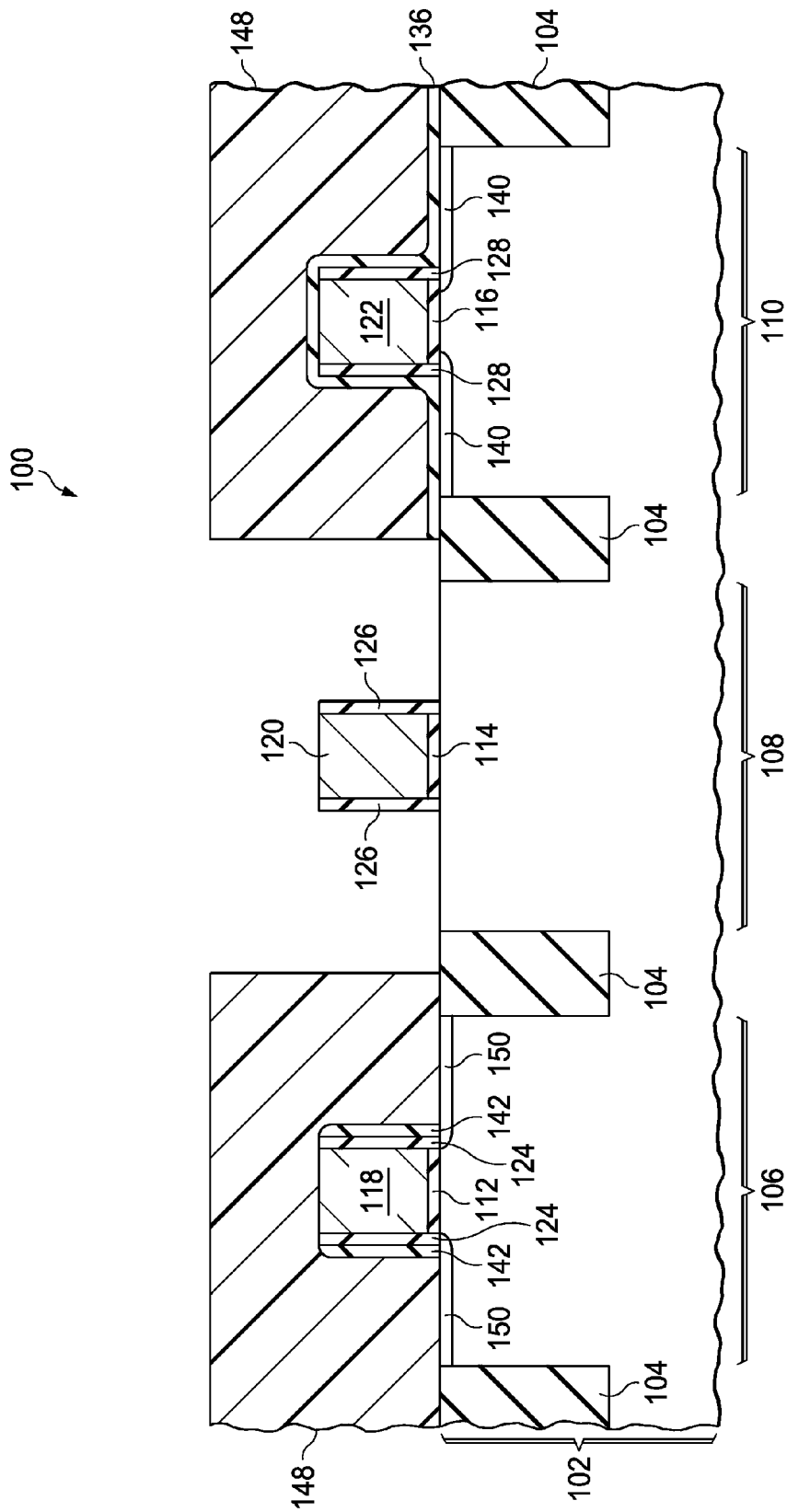

Referring to FIG. 1F, an epitaxial spacer layer etch process is performed which removes substantially all of the epitaxial spacer layer 136 in the area for the second transistor 108 exposed by the second transistor LDD implant mask 148. In one version of the instant example, the epitaxial spacer layer etch process may be an RIE process. In another version, the epitaxial spacer layer etch process may be a wet etch process. A wet etch step using a dilute aqueous solution of hydrofluoric acid may be used to remove a layer of silicon dioxide in the epitaxial spacer layer 136. A wet etch step using an aqueous solution of phosphoric acid may be used to remove a layer of silicon nitride in the epitaxial spacer layer 136.

Figure 1G:
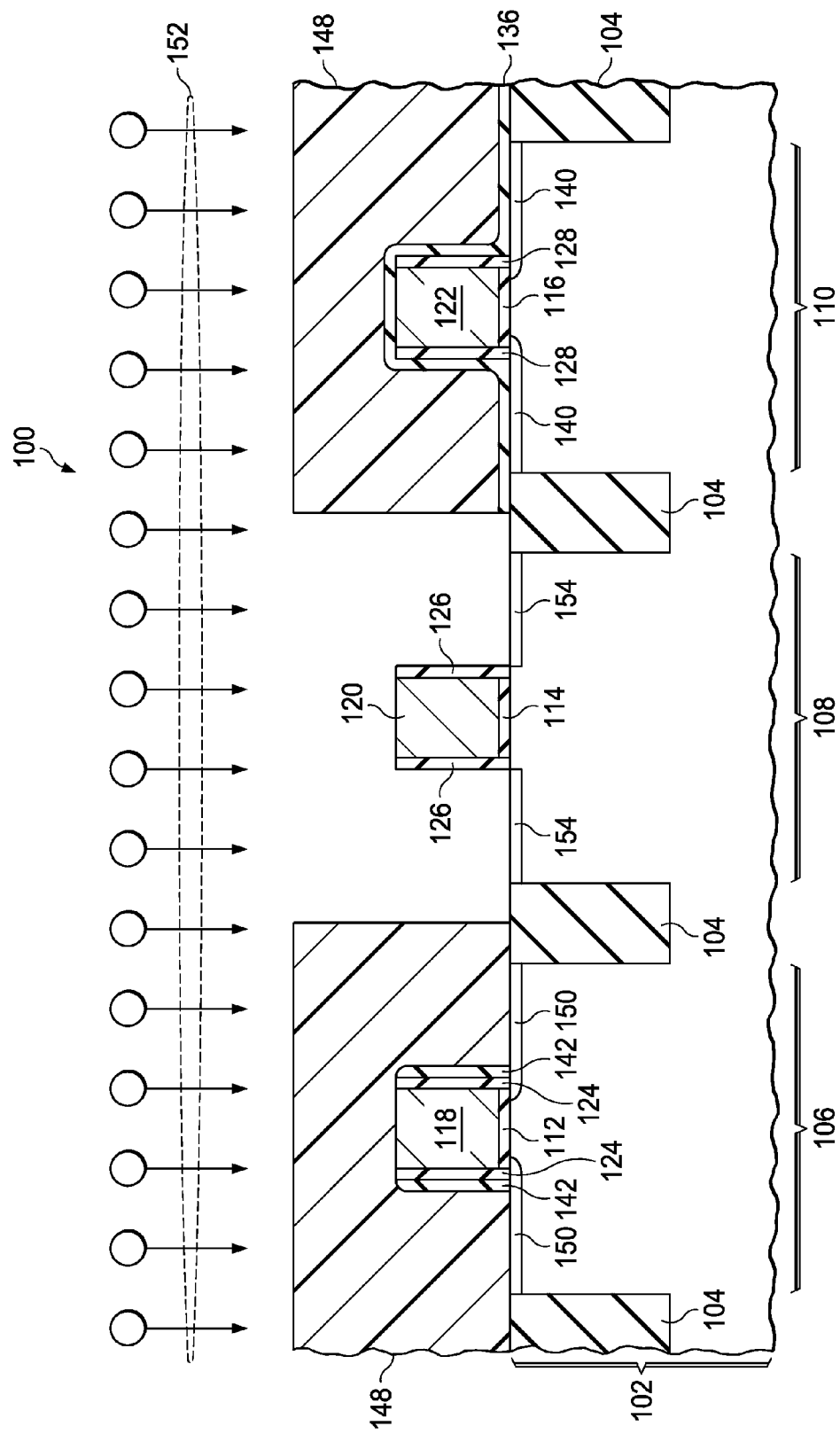

Referring to FIG. 1G, a second transistor LDD ion implant process is performed which implants second transistor LDD dopants 152 into the substrate 102 adjacent to the second gate 120 to form second transistor LDD implanted regions 154 of the first conductivity type. The second transistor LDD dopants 152 may have a dose similar to the dose of the first transistor LDD dopants 144. The second transistor LDD implant mask 148 is removed after the second transistor LDD ion implant process is completed, for example as described in reference to the third transistor LDD implant mask 130.

Figure 1H:
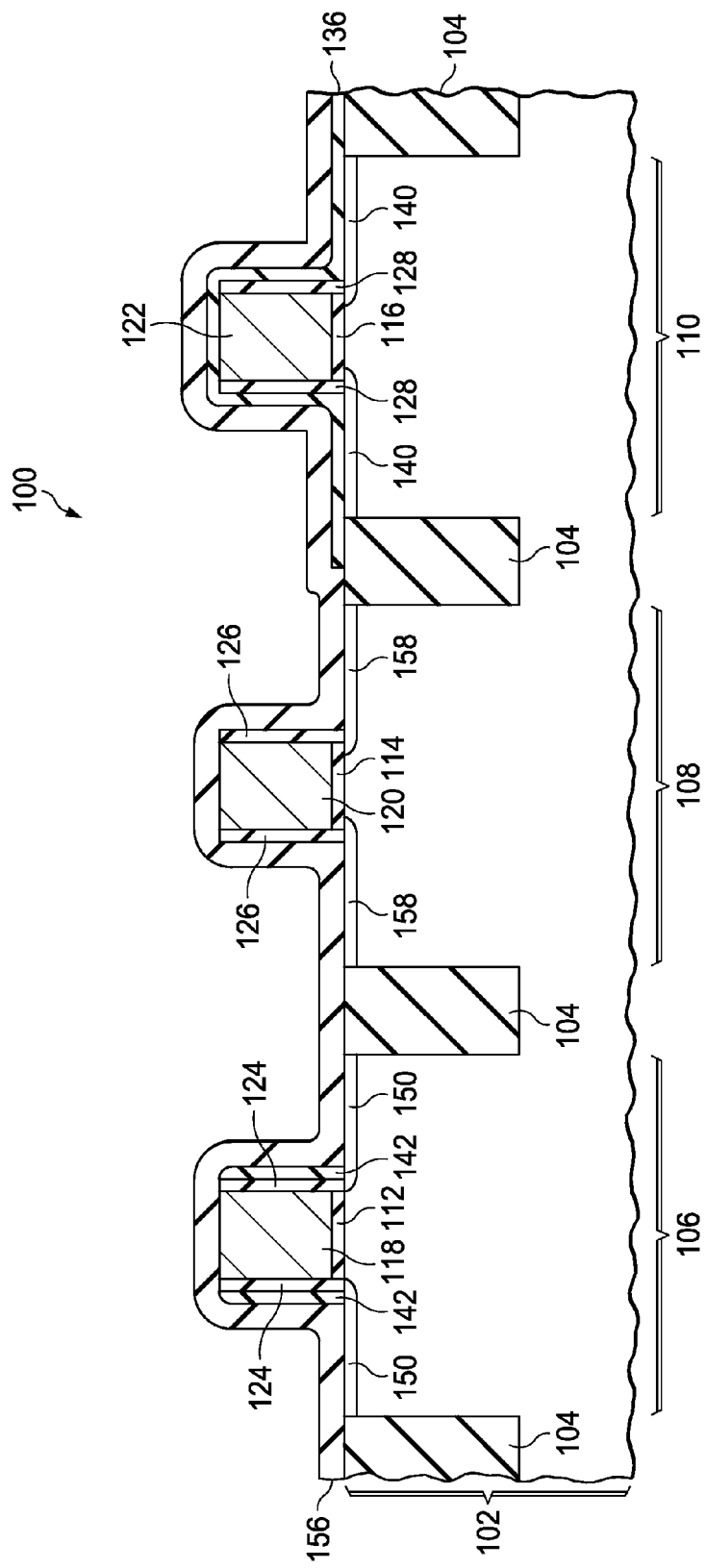

Referring to FIG. 1H, a conformal epitaxial blocking layer 156 is formed over the integrated circuit 100. The epitaxial blocking layer 156 may be for example, between 10 and 20 nanometers thick, and may include, for example, one or more layers of silicon nitride and/or silicon dioxide. The epitaxial blocking layer 156 may be formed, for example, by reaction of hexachlorodisilane and ammonia at a temperature between 450 c and 600 C.

An anneal operation activates dopants in the second transistor LDD implanted regions 154 to form second transistor LDD regions 158. The anneal operation may be performed prior to, or subsequent to, formation of the epitaxial blocking layer 156. In one version of the instant example, the dopants in the second transistor LDD implanted regions 154 may be activated concurrently with the dopants in the first transistor LDD implanted regions 146. In the instant example, the second transistor LDD regions 158 extend farther under the second gate 120 that the first transistor LDD implanted regions 146 extend under the first gate 118.

Figure 1I:
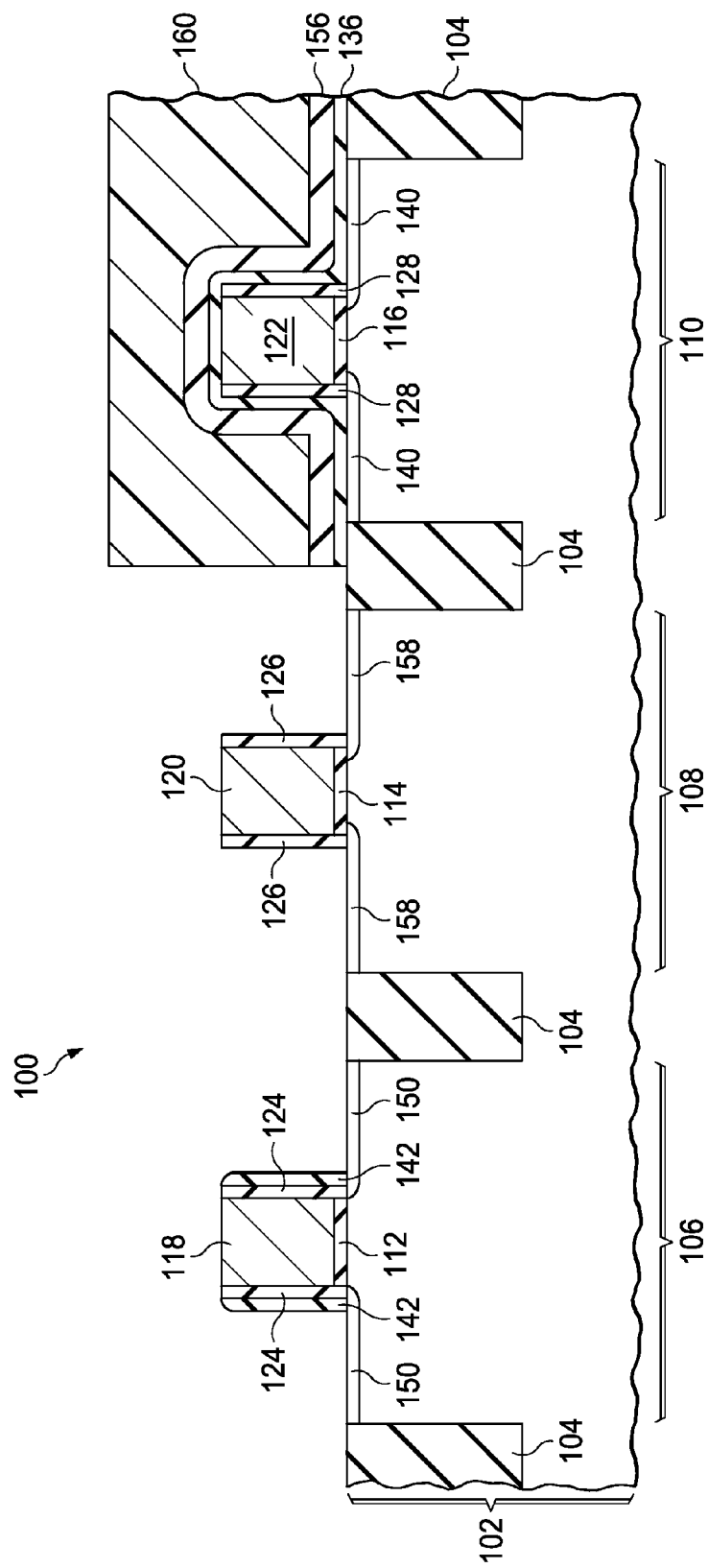

Referring to FIG. 1I, an epitaxial blocking layer etch mask 160 is formed over the integrated circuit 100 which covers the area for the third transistor 110 and exposes the area for the first transistor 106 and the area for the second transistor 108. The epitaxial blocking layer etch mask 160 may, for example, include photoresist and be formed using a photolithographic process. An epitaxial blocking layer etch process is performed which removes material from the epitaxial blocking layer 156 in the area for the first transistor 106 and the area for the second transistor 108. The epitaxial blocking layer etch mask 160 is removed after the epitaxial blocking layer etch process is completed, for example as described in reference to the third transistor LDD implant mask 130.

Figure 1J:
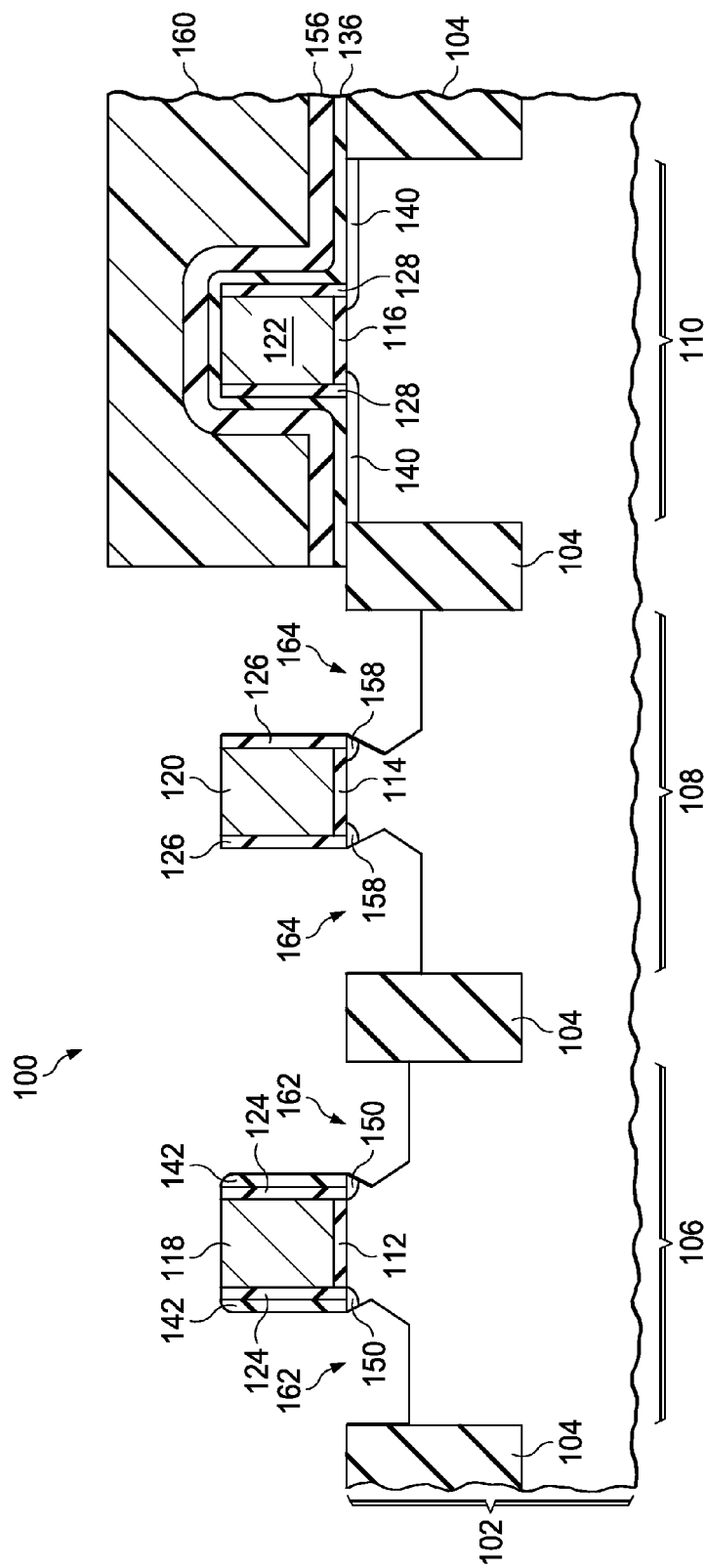

Referring to FIG. 1J, a source/drain etch process is performed which removes material from the substrate 102 in source and drain regions of the area for the first transistor 106 and the area for the second transistor 108, so as to form first source/drain etched regions 162 adjacent to the first gate 118 and second source/drain etched regions 164 adjacent to the second gate 120. Due to the presence of the epitaxial spacers 142 adjacent to the first gate 118, the first source/drain etched regions 162 are separated from the first gate 118 at the top surface of the substrate 102 by a lateral distance on each side of the first gate 118 that is greater than a lateral distance on each side of the second gate 120 which separates the second source/drain etched regions 164 from the second gate 120 at the top surface of the substrate 102. In one version of the instant example, due to the presence of the epitaxial spacers 142 adjacent to the first gate 118, the second source/drain etched regions 164 may extend deeper into the substrate 102 than the first source/drain etched regions 162 by 2 to 5 nanometers. The epitaxial blocking layer etch mask 160 is removed after the source/drain etch process is completed, for example as described in reference to the third transistor LDD implant mask 130.

Figure 1K:
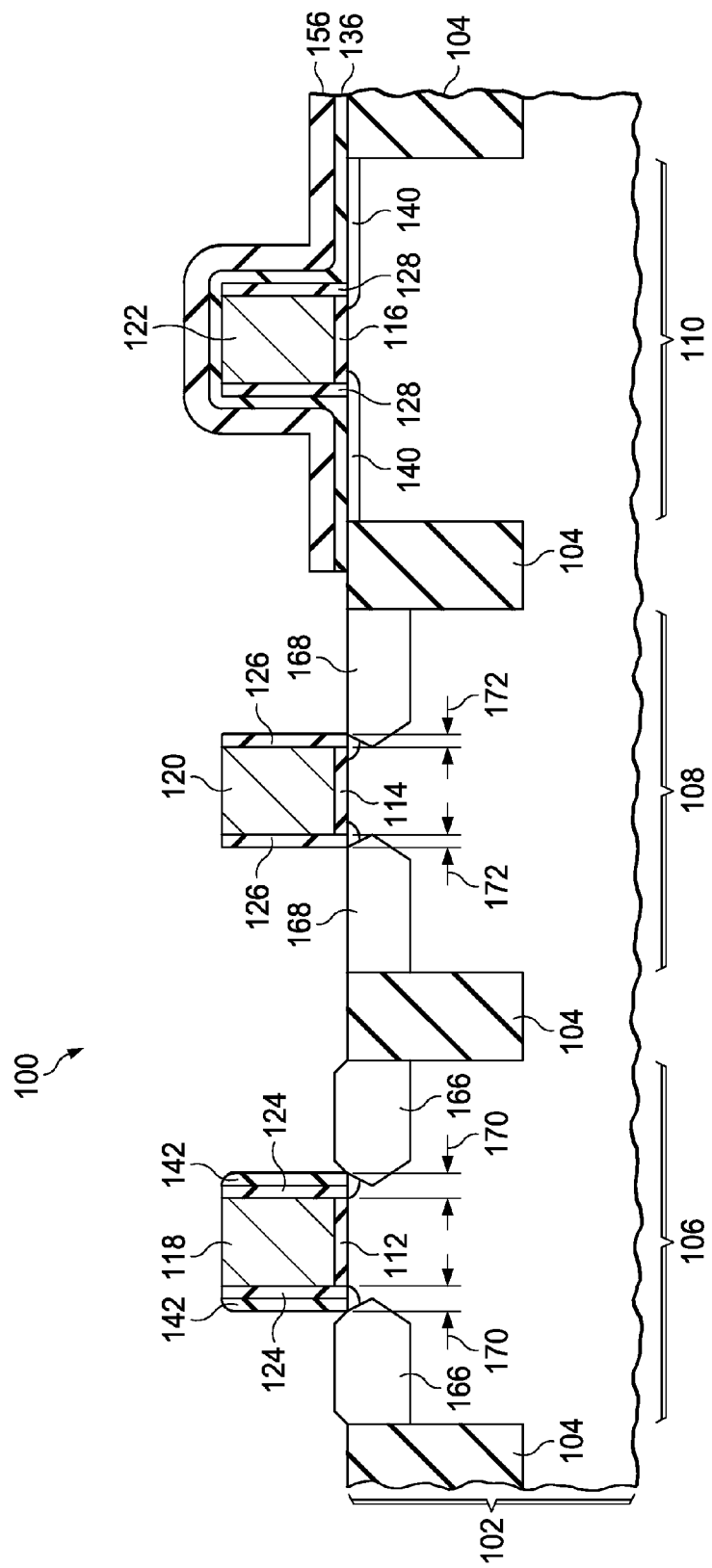

Referring to FIG. 1K, a source/drain epitaxial process is performed which grows source/drain epitaxial material in the first source/drain etched regions 162 and in the second source/drain etched regions 164 to form first epitaxial source/drain regions 166 adjacent to the first gate 118 and second epitaxial source/drain regions 168 adjacent to the second gate 120, respectively. Due to the presence of the epitaxial spacers 142 adjacent to the first gate 118, the first epitaxial source/drain regions 166 are separated from the first gate 118 at the top surface of the substrate 102 by a first lateral space 170 on each side of the first gate 118 that is greater by at least 2 nanometers than a second lateral space 172 on each side of the second gate 120 which separates the second epitaxial source/drain regions 168 from the second gate 120 at the top surface of the substrate 102. In one version of the instant example, the first lateral space 170 is larger than the second lateral space 172 by 2 to 5 nanometers. In one version of the instant example, the first epitaxial source/drain regions 166 may be thicker than the second epitaxial source/drain regions 168 by 2 to 5 nanometers.

Figure 1L:
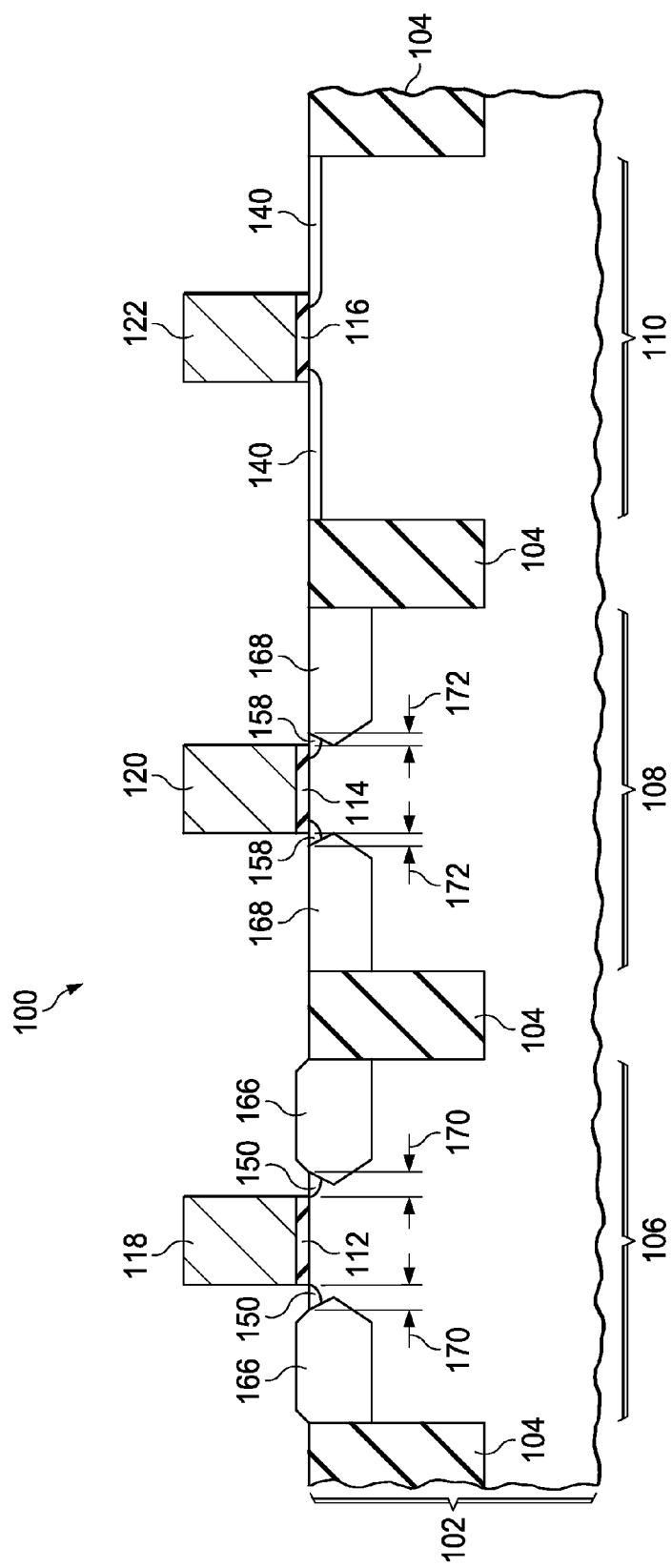

Referring to FIG. 1L, a portion or substantially all of the epitaxial spacers 142 may be removed from the area for the first transistor 106. A portion or substantially all of the first gate offset spacers 124 may be removed from the first gate 118. A portion or substantially all of the second gate offset spacers 126 may be removed from the second gate 120. Substantially all of the epitaxial blocking layer 156 is removed from the area for the third transistor 110. Substantially all of the epitaxial spacer layer 136 is removed from the area for the third transistor 110. A portion or substantially all of the third gate offset spacers 128 may be removed from the third gate 122.

In one version of the instant example, the first transistor 106 and the second transistor 108 may be p-channel, and the first epitaxial source/drain regions 166 and the second epitaxial source/drain regions 168 may include silicon germanium (SiGe) semiconductor material with an atomic fraction of germanium between 20 percent and 70 percent. Furthermore in this version, the first transistor 106 may be part of an SRAM cell and the second transistor 108 may be part of a logic gate.

In another version of the instant example, the first transistor 106 and the second transistor 108 may be n-channel, and the first epitaxial source/drain regions 166 and the second epitaxial source/drain regions 168 may include silicon carbide (SiC) semiconductor material with an atomic fraction of carbon between 0.5 percent and 3 percent. Furthermore in this version, the first transistor 106 may be part of a logic gate and the second transistor 108 may be part of an SRAM cell.

Figure 2A:
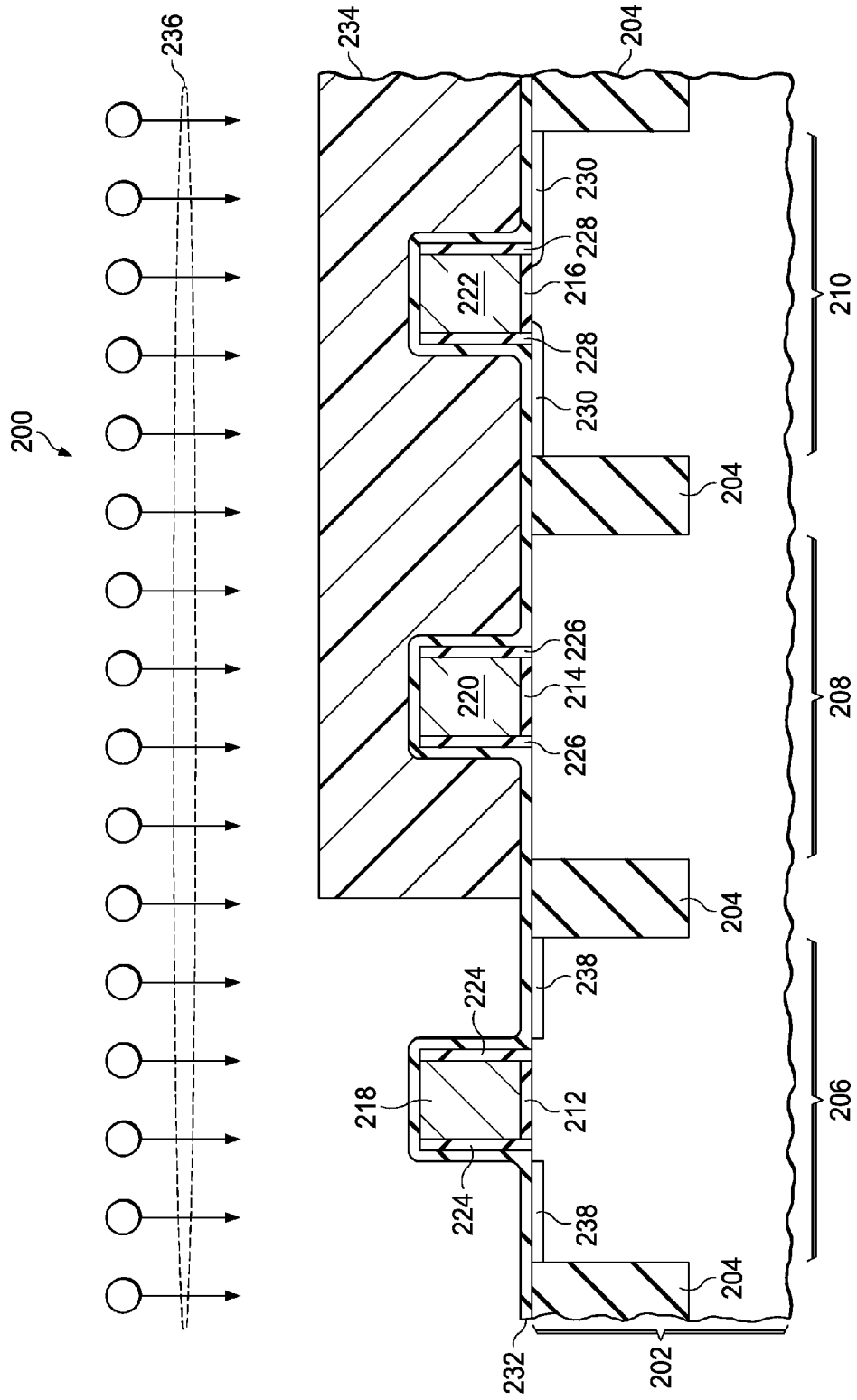
FIG. 2A through FIG. 2E are cross sections of an integrated circuit containing two transistors of a same polarity with epitaxial source/drain layers formed according to another example, depicted in successive stages of fabrication.

FIG. 2A through FIG. 2E are cross sections of an integrated circuit containing two transistors of a same polarity with epitaxial source/drain layers formed according to another example, depicted in successive stages of fabrication. Referring to FIG. 2A, the integrated circuit 200 is formed in an on a semiconductor substrate 202 for example as described in reference to FIG. 1A. Elements of field oxide 204 may be formed at a top surface of the substrate 202. The integrated circuit 200 includes a first area defined for a first transistor 206 having the first polarity, a second area defined for a second transistor 208 having the first polarity, and a third area defined for a third transistor 210 having the second polarity. In one version of the instant example, the first polarity may be p-channel and the second polarity may be n-channel. In another version, the first polarity may be n-channel and the second polarity may be p-channel.

A first gate dielectric layer 212 is formed on the substrate 202 in the area for the first transistor 206, a second gate dielectric layer 214 is formed on the substrate 202 in the area for the second transistor 208, and a third gate dielectric layer 216 is formed on the substrate 202 in the area for the third transistor 210, for example as described in reference to FIG. 1A. A first gate 218 is formed on the first gate dielectric layer 212, a second gate 220 is formed on the second gate dielectric layer 214, and a third gate 222 is formed on the third gate dielectric layer 216, for example as described in reference to FIG. 1A. Optional first gate offset spacers 224 may be formed on lateral surfaces of the first gate 218, optional second gate offset spacers 226 may be formed on lateral surfaces of the second gate 220, and/or optional third gate offset spacers 228 may be formed on lateral surfaces of the third gate 222, for example as described in reference to FIG. 1A. Third transistor LDD regions 230 having the second conductivity type are formed in the substrate 202 adjacent to the third gate 222, for example as described in reference to FIG. 1A and FIG. 1B.

A conformal epitaxial spacer layer 232 is formed over the integrated circuit 200 for example as described in reference to FIG. 1B. A first transistor LDD implant mask 234 is formed over the area for the second transistor 208 and the area for the third transistor 210 so as to expose the area for the first transistor 206. The first transistor LDD implant mask 234 may be formed as described in reference to the third transistor LDD implant mask 130 of FIG. 1A. A first transistor LDD ion implant process is performed which implants first transistor LDD dopants 236 through the epitaxial spacer layer 232 into the substrate 202 adjacent to the first gate 218 to form first transistor LDD implanted regions 238 of the first conductivity type. In contrast to the example of FIG. 1A-1L, the first transistor LDD ion implant process is performed prior to anisotropically etching the epitaxial spacer layer 232. A dose of the first transistor LDD dopants 236 may be, for example, in the range described in reference to the first transistor LDD dopants 144 of FIG. 1D. The dose of the first transistor LDD ion implant process may be adjusted to attain a desired amount of the first transistor LDD dopants 236 in the substrate 202 after a portion of the first transistor LDD dopants 236 are absorbed by the epitaxial spacer layer 232.

Figure 2B:
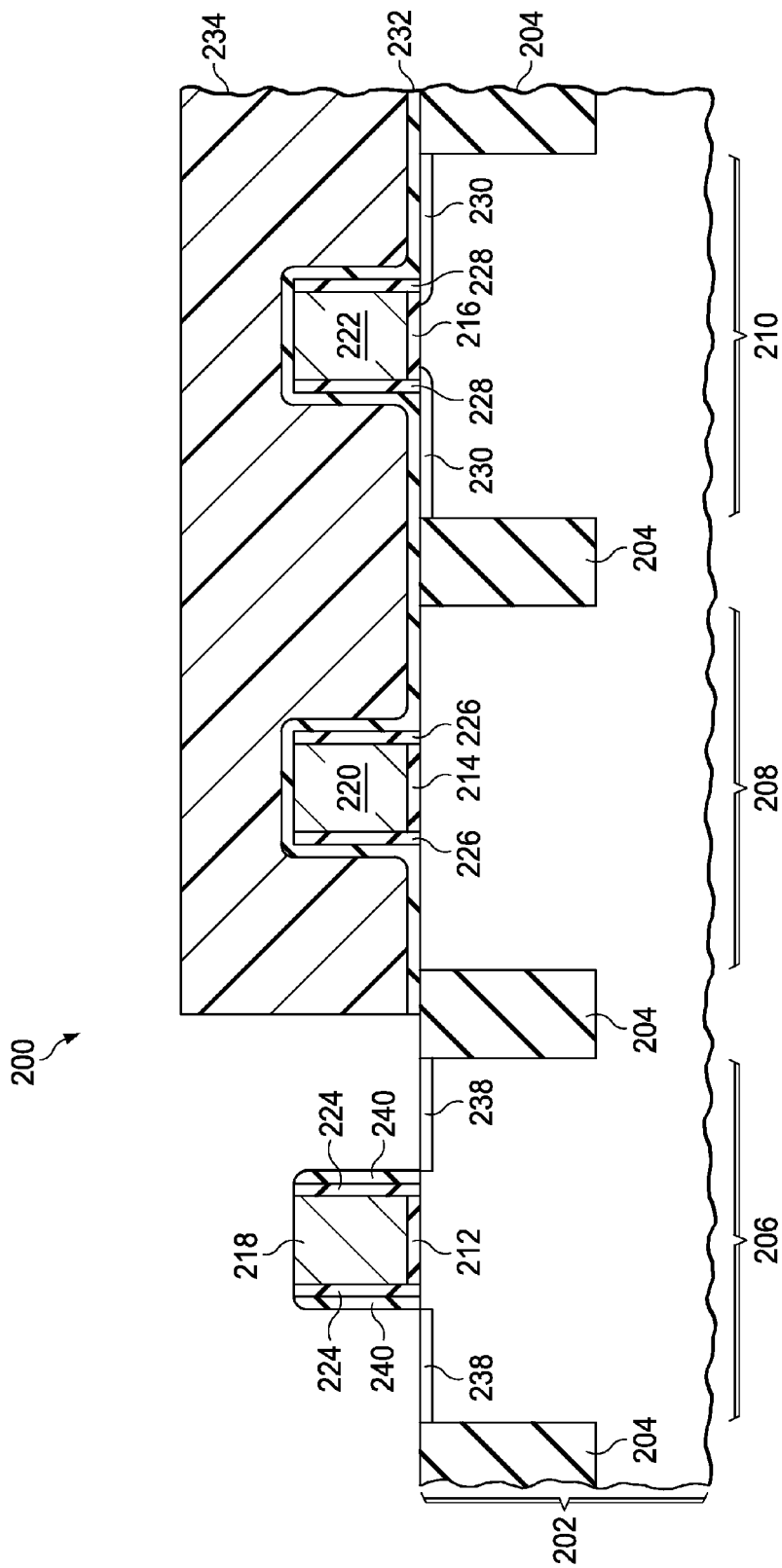

Referring to FIG. 2B, an epitaxial spacer anisotropic etch process is performed which removes material of the epitaxial spacer layer 232 from horizontal surfaces on the substrate 202 and first gate 218 so as to leave epitaxial spacers 240 adjacent to the first gate 218; on vertical surfaces of the first gate offset spacers 224 if present, or on vertical surfaces of the first gate 218 if the first gate offset spacers 224 are not present, for example as described in reference to FIG. 1C. The first transistor LDD implant mask 234 is removed after the epitaxial spacer anisotropic etch process is completed, for example as described in reference to the third transistor LDD implant mask 130.

Figure 2C:
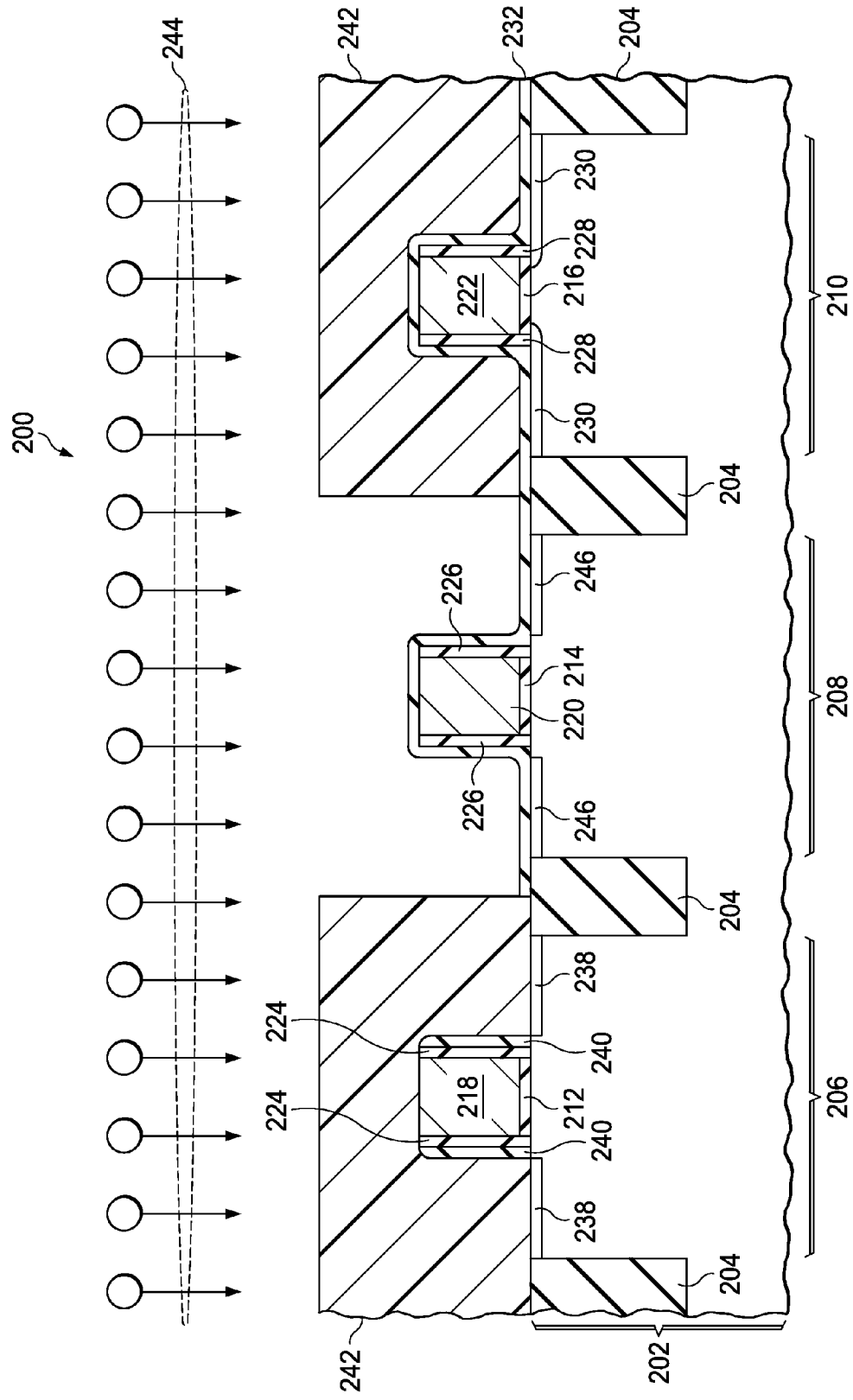

Referring to FIG. 2C, a second transistor LDD implant mask 242 is formed over the area for the first transistor 206 and the area for the third transistor 210 so as to expose the area for the second transistor 208. The second transistor LDD implant mask 242 may be formed as described in reference to the third transistor LDD implant mask 130 of FIG. 1A. A second transistor LDD ion implant process is performed which implants second transistor LDD dopants 244 through the epitaxial spacer layer 232 into the substrate 202 adjacent to the second gate 220 to form second transistor LDD implanted regions 246 of the first conductivity type. In contrast to the example of FIG. 1A-1L, the second transistor LDD ion implant process is performed prior to removing the epitaxial spacer layer 232 in the area for the second transistor. A dose of the second transistor LDD dopants 244 may be, for example, in the range described in reference to the second transistor LDD dopants 152 of FIG. 1G. The dose of the second transistor LDD ion implant process may be adjusted to attain a desired amount of the second transistor LDD dopants 244 in the substrate 202 after a portion of the second transistor LDD dopants 244 are absorbed by the epitaxial spacer layer 232.

Figure 2D:
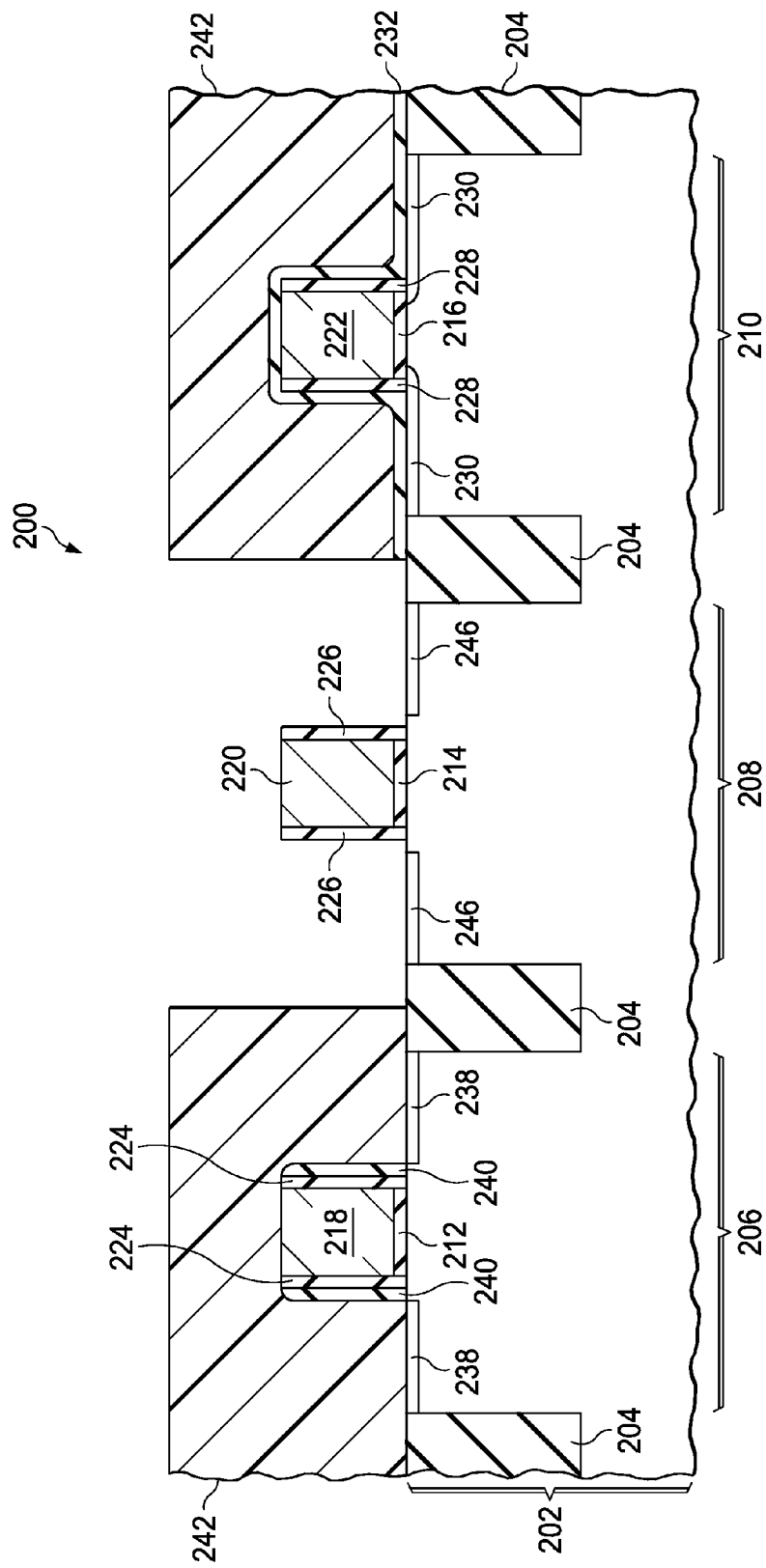

Referring to FIG. 2D, an epitaxial spacer layer etch process is performed which removes substantially all of the epitaxial spacer layer 232 in the area for the second transistor 208 exposed by the second transistor LDD implant mask 242, for example as described in reference to FIG. 1F. The second transistor LDD implant mask 242 is removed after the epitaxial spacer layer etch process is completed, for example as described in reference to the third transistor LDD implant mask 130.

Figure 2E:
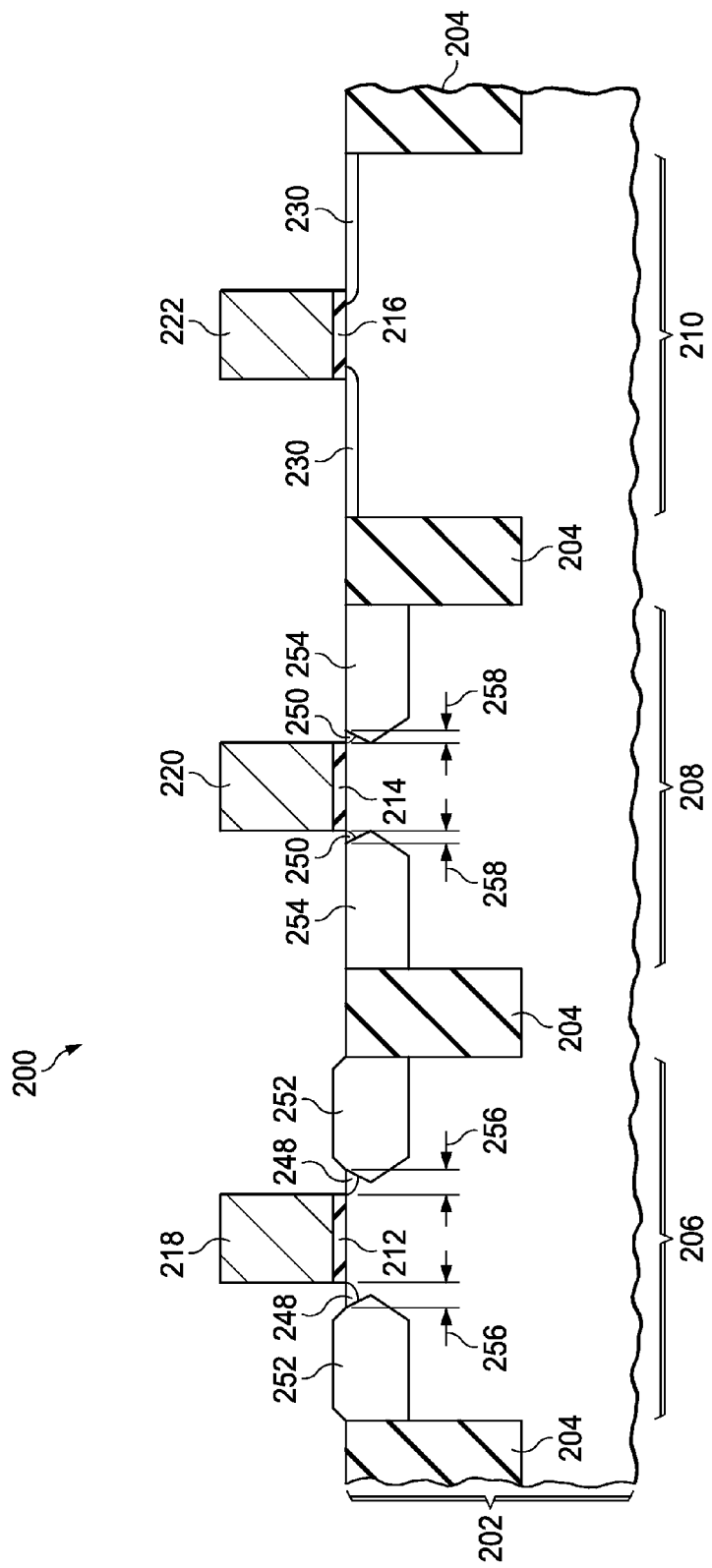

Referring to FIG. 2E, dopants in the first transistor LDD implanted regions 238 of FIG. 2A are activated to form first transistor LDD regions 248, and dopants in the second transistor LDD implanted regions 246 are activated to form second transistor LDD regions 250. First epitaxial source/drain regions 252 are formed adjacent to the first gate 218 and second epitaxial source/drain regions 254 are formed adjacent to the second gate 220, for example as described in reference to FIG. 1H through FIG. 1K. Due to the presence of the epitaxial spacers 240 adjacent to the first gate 218, the first epitaxial source/drain regions 252 are separated from the first gate 218 at the top surface of the substrate 202 by a first lateral space 256 on each side of the first gate 218 that is greater by at least 2 nanometers than a second lateral space 258 on each side of the second gate 220 which separates the second epitaxial source/drain regions 254 from the second gate 220 at the top surface of the substrate 202. In one version of the instant example, the first lateral space 256 is larger than the second lateral space 258 by 2 to 5 nanometers. In one version of the instant example, the first epitaxial source/drain regions 252 may be thicker than the second epitaxial source/drain regions 254 by 2 to 5 nanometers.

In one version of the instant example, the first transistor 206 and the second transistor 208 may be p-channel, and the first epitaxial source/drain regions 252 and the second epitaxial source/drain regions 254 may include silicon germanium (SiGe) semiconductor material as described in reference to FIG. 1L. Furthermore in this version, the first transistor 206 may be part of an SRAM cell and the second transistor 208 may be part of a logic gate. In another version of the instant example, the first transistor 206 and the second transistor 208 may be n-channel, and the first epitaxial source/drain regions 252 and the second epitaxial source/drain regions 254 may include silicon carbide (SiC) semiconductor material as described in reference to FIG. 1L. Furthermore in this version, the first transistor 206 may be part of a logic gate and the second transistor 208 may be part of an SRAM cell.

Figure 3A:
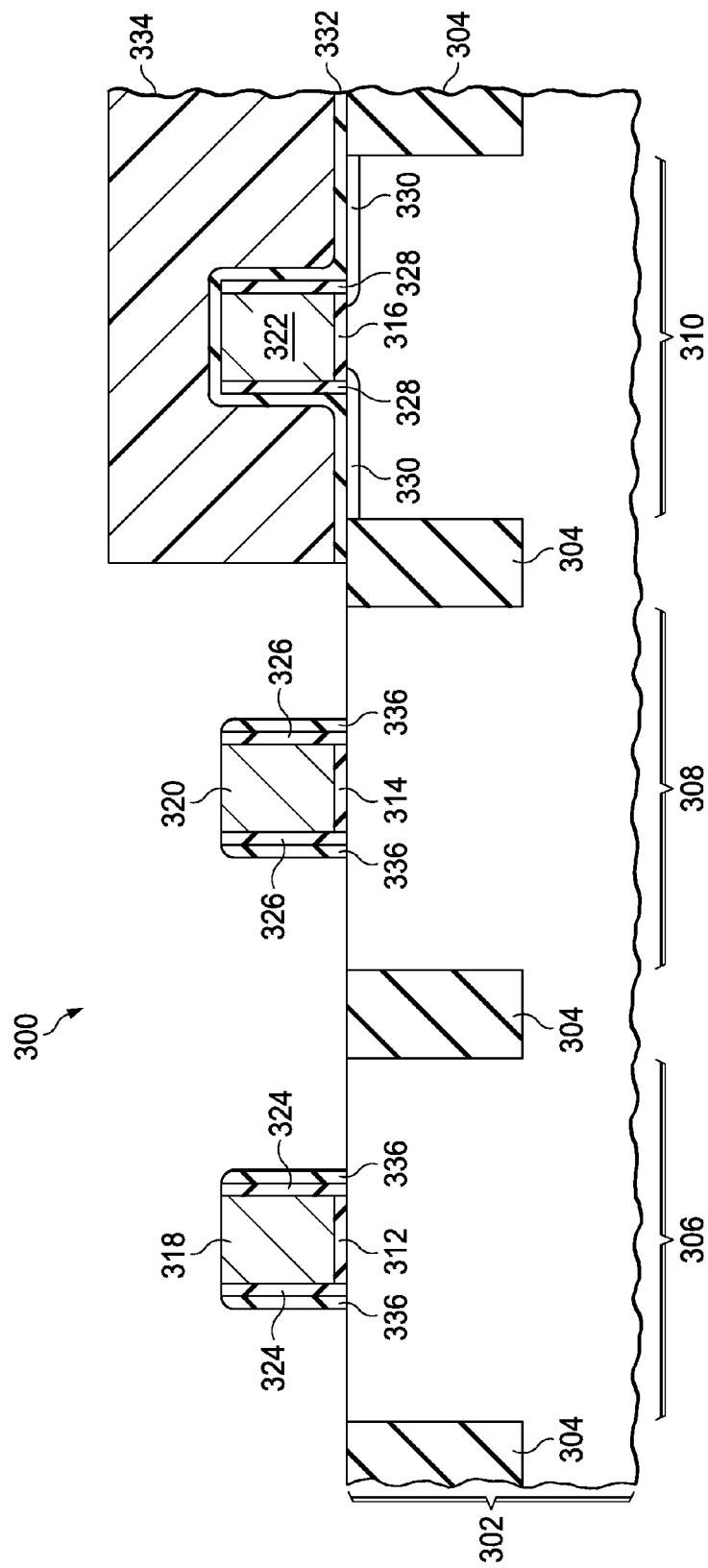
FIG. 3A through FIG. 3E are cross sections of an integrated circuit containing two transistors of a same polarity with epitaxial source/drain layers formed according to a further example, depicted in successive stages of fabrication.

FIG. 3A through FIG. 3E are cross sections of an integrated circuit containing two transistors of a same polarity with epitaxial source/drain layers formed according to a further example, depicted in successive stages of fabrication. Referring to FIG. 3A, the integrated circuit 300 is formed in an on a semiconductor substrate 302 for example as described in reference to FIG. 1A. Elements of field oxide 304 may be formed at a top surface of the substrate 302. The integrated circuit 300 includes a first area defined for a first transistor 306 having the first polarity, a second area defined for a second transistor 308 having the first polarity, and a third area defined for a third transistor 310 having the second polarity. In one version of the instant example, the first polarity may be p-channel and the second polarity may be n-channel. In another version, the first polarity may be n-channel and the second polarity may be p-channel.

A first gate dielectric layer 312 is formed on the substrate 302 in the area for the first transistor 306, a second gate dielectric layer 314 is formed on the substrate 302 in the area for the second transistor 308, and a third gate dielectric layer 316 is formed on the substrate 302 in the area for the third transistor 310, for example as described in reference to FIG. 1A. A first gate 318 is formed on the first gate dielectric layer 312, a second gate 320 is formed on the second gate dielectric layer 314, and a third gate 322 is formed on the third gate dielectric layer 316, for example as described in reference to FIG. 1A. Optional first gate offset spacers 324 may be formed on lateral surfaces of the first gate 318, optional second gate offset spacers 326 may be formed on lateral surfaces of the second gate 320, and/or optional third gate offset spacers 328 may be formed on lateral surfaces of the third gate 322, for example as described in reference to FIG. 1A. Third transistor LDD regions 330 having the second conductivity type are formed in the substrate 302 adjacent to the third gate 322, for example as described in reference to FIG. 1A and FIG. 1B.

A conformal epitaxial spacer layer 332 is formed over the integrated circuit 300, for example as described in reference to FIG. 1B. A first transistor LDD implant mask 334 is formed over the area for the third transistor 310 so as to expose the area for the first transistor 306 and the area for the second transistor 308. The first transistor LDD implant mask 334 may be formed as described in reference to the third transistor LDD implant mask 130 of FIG. 1A. An epitaxial spacer anisotropic etch process is performed which removes material of the epitaxial spacer layer 332 from horizontal surfaces on the substrate 302, the first gate 318 and the second gate 320 so as to leave epitaxial spacers 336 adjacent to the first gate 318 and the second gate 320; on vertical surfaces of the first gate offset spacers 324 and the second gate offset spacers 326 if present, or on vertical surfaces of the first gate 318 and the second gate 320 if the first gate offset spacers 324 and second gate offset spacers 326 are not present, for example as described in reference to FIG. 1C.

Figure 3B:
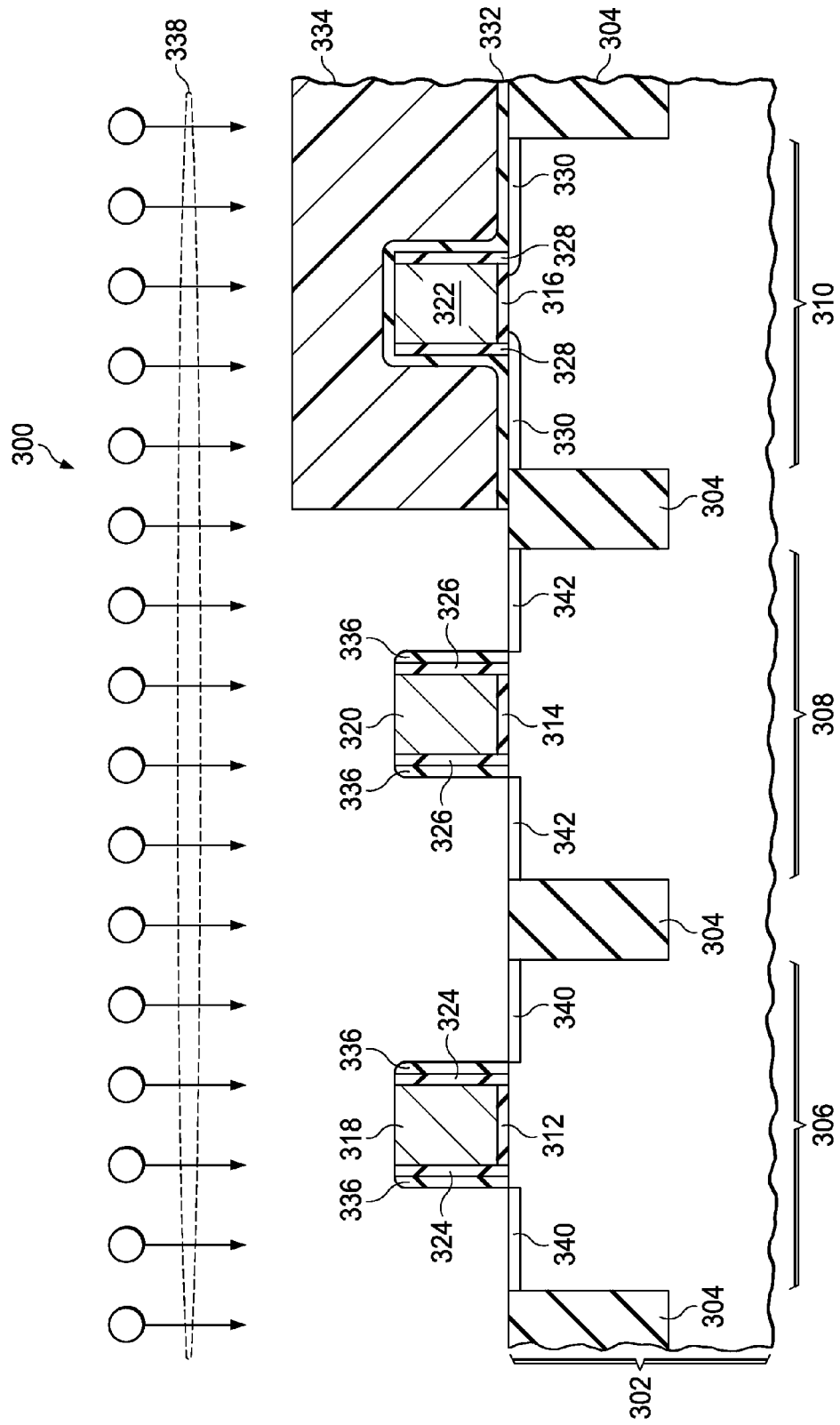

Referring to FIG. 3B, a first transistor LDD ion implant process is performed which implants first transistor LDD dopants 338 into the substrate 302 adjacent to the first gate 318 and the second gate 320 to form first transistor LDD implanted regions 340 and second transistor LDD implanted regions 342, respectively, of the first conductivity type. A dose of the first transistor LDD dopants 338 may be, for example, in the range described in reference to the first transistor LDD dopants 144 of FIG. 1D. The first transistor LDD implant mask 334 is removed after the first transistor LDD ion implant process is completed, for example as described in reference to the third transistor LDD implant mask 130.

Figure 3C:
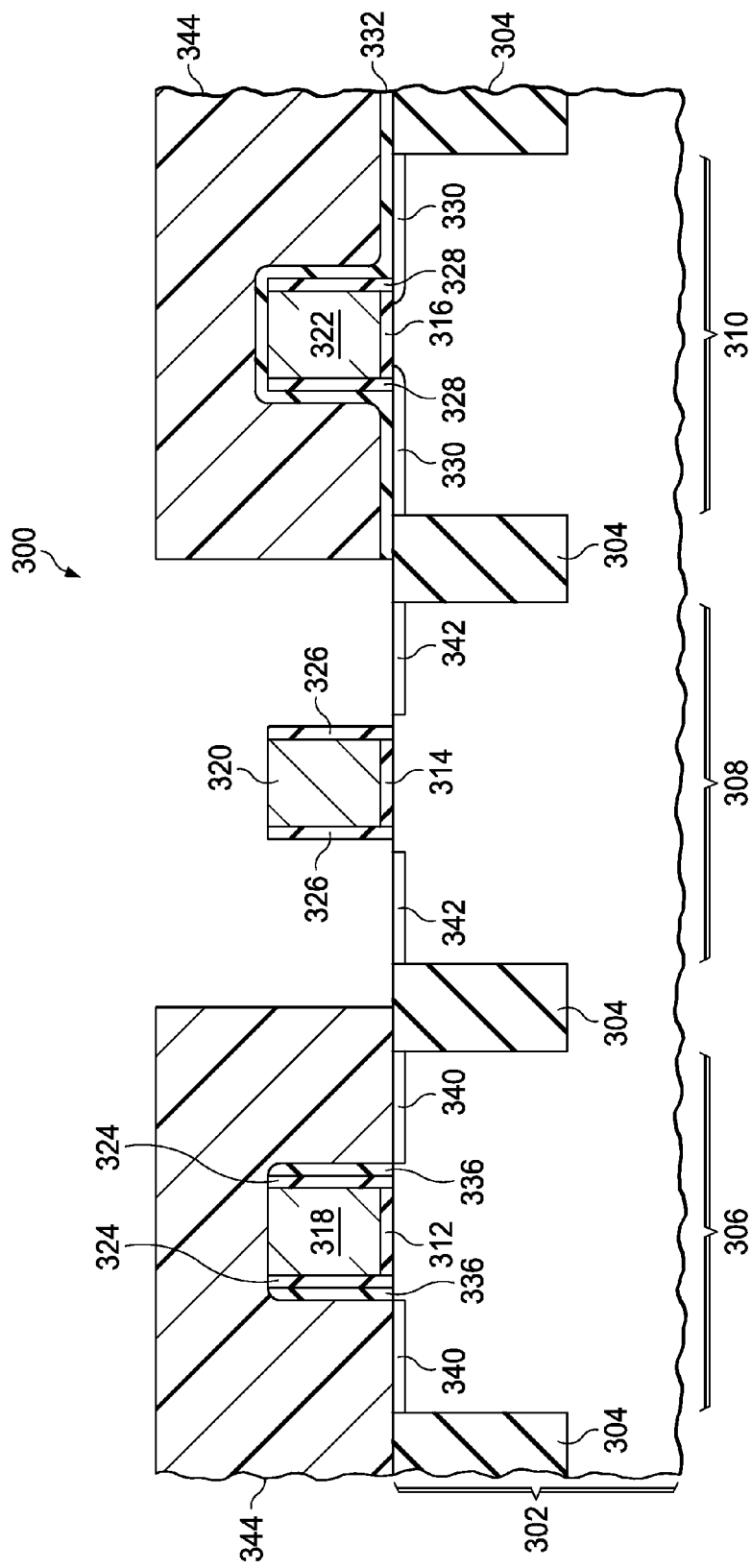

Referring to FIG. 3C, a second transistor LDD implant mask 344 is formed over the area for the first transistor 306 and the area for the third transistor 310 so as to expose the area for the second transistor 308. The second transistor LDD implant mask 344 may be formed as described in reference to the third transistor LDD implant mask 130 of FIG. 1A. An epitaxial spacer layer etch process is performed which removes substantially all of the epitaxial spacer 336 in the area for the second transistor 308 exposed by the second transistor LDD implant mask 344, for example as described in reference to FIG. 1F.

Figure 3D:
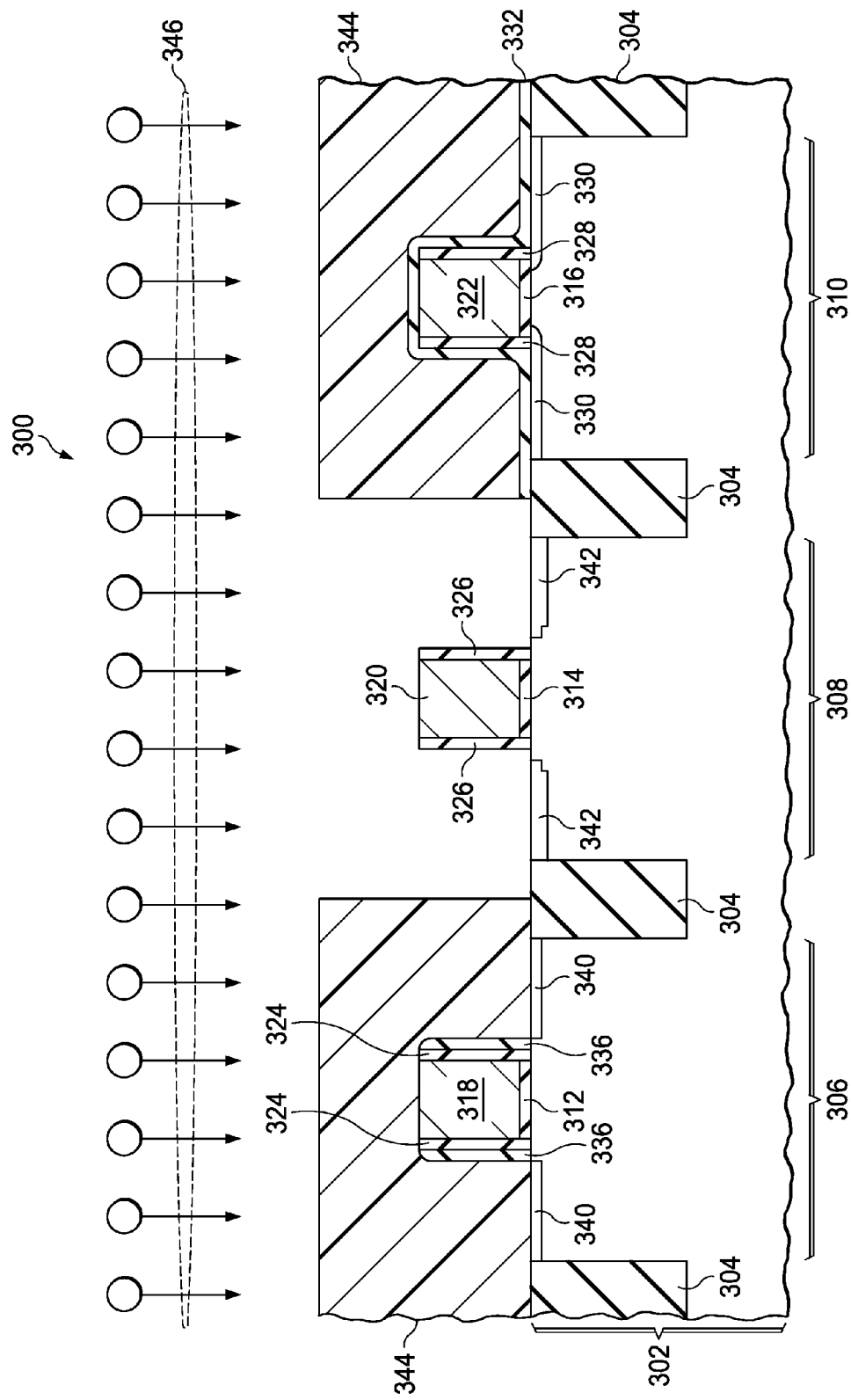

Referring to FIG. 3D, a second transistor LDD ion implant process is performed which implants second transistor LDD dopants 346 into the substrate 302 adjacent to the second gate 320 to augment the second transistor LDD implanted regions 342. A dose of the second transistor LDD dopants 346 may be, for example, between $1 \times 10^{13}$ cm$^{-2}$ and $5 \times 10^{14}$ cm$^{-2}$. The second transistor LDD implant mask 344 is removed after the second transistor LDD ion implant process is completed, for example as described in reference to the third transistor LDD implant mask 130.

Figure 3E:
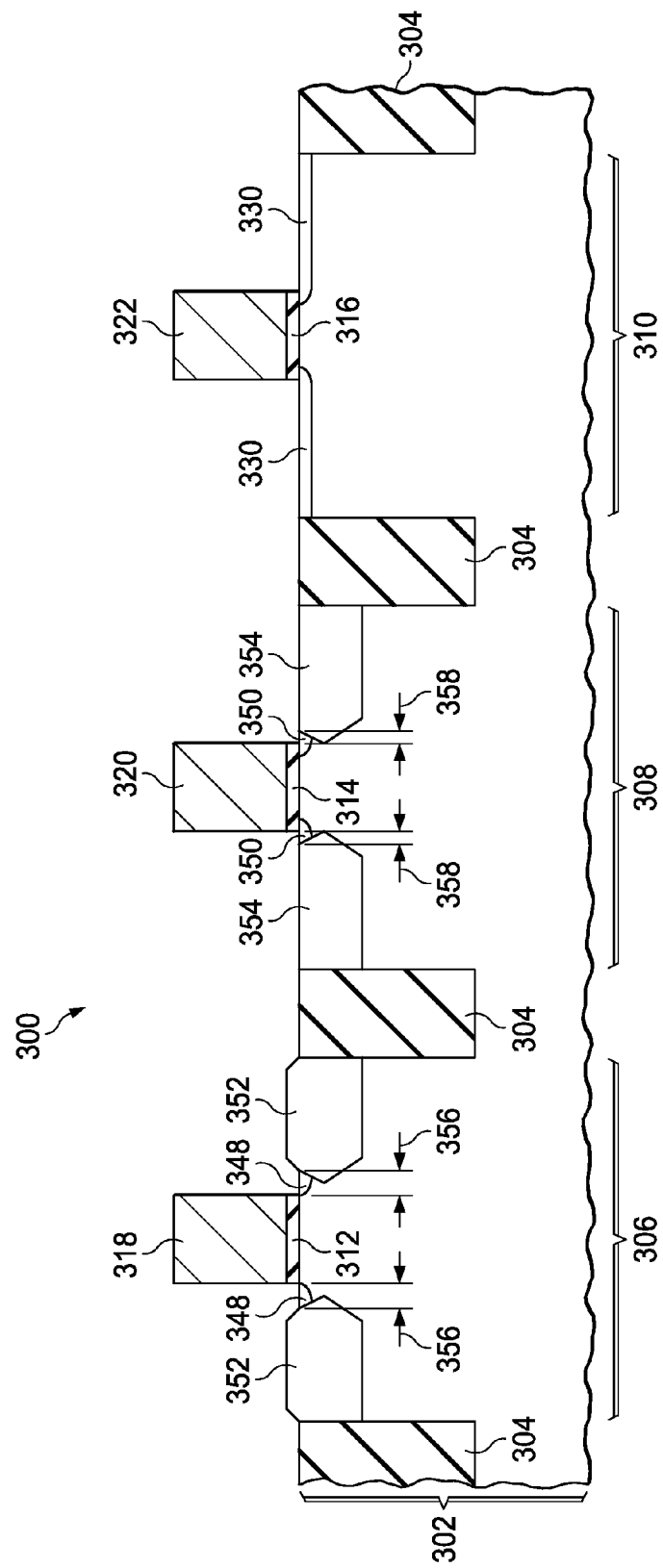

Referring to FIG. 3E, dopants in the first transistor LDD implanted regions 340 of FIG. 3B are activated to form first transistor LDD regions 348, and dopants in the second transistor LDD implanted regions 342 of FIG. 3D are activated to form second transistor LDD regions 350. First epitaxial source/drain regions 352 are formed adjacent to the first gate 318 and second epitaxial source/drain regions 354 are formed adjacent to the second gate 320, for example as described in reference to FIG. 1H through FIG. 1K. Due to the presence of the epitaxial spacers 336 adjacent to the first gate 318, the first epitaxial source/drain regions 352 are separated from the first gate 318 at the top surface of the substrate 302 by a first lateral space 356 on each side of the first gate 318 that is greater by at least 2 nanometers than a second lateral space 358 on each side of the second gate 320 which separates the second epitaxial source/drain regions 354 from the second gate 320 at the top surface of the substrate 302. In one version of the instant example, the first lateral space 356 is larger than the second lateral space 358 by 2 to 5 nanometers. In one version of the instant example, the first epitaxial source/drain regions 352 may be thicker than the second epitaxial source/drain regions 354 by 2 to 5 nanometers.

In one version of the instant example, the first transistor 306 and the second transistor 308 may be p-channel, and the first epitaxial source/drain regions 352 and the second epitaxial source/drain regions 354 may include silicon germanium (SiGe) semiconductor material as described in reference to FIG. 1L. Furthermore in this version, the first transistor 306 may be part of an SRAM cell and the second transistor 308 may be part of a logic gate. In another version of the instant example, the first transistor 306 and the second transistor 308 may be n-channel, and the first epitaxial source/drain regions 352 and the second epitaxial source/drain regions 354 may include silicon carbide (SiC) semiconductor material as described in reference to FIG. 1L. Furthermore in this version, the first transistor 306 may be part of a logic gate and the second transistor 308 may be part of an SRAM cell.

Figure 4A:
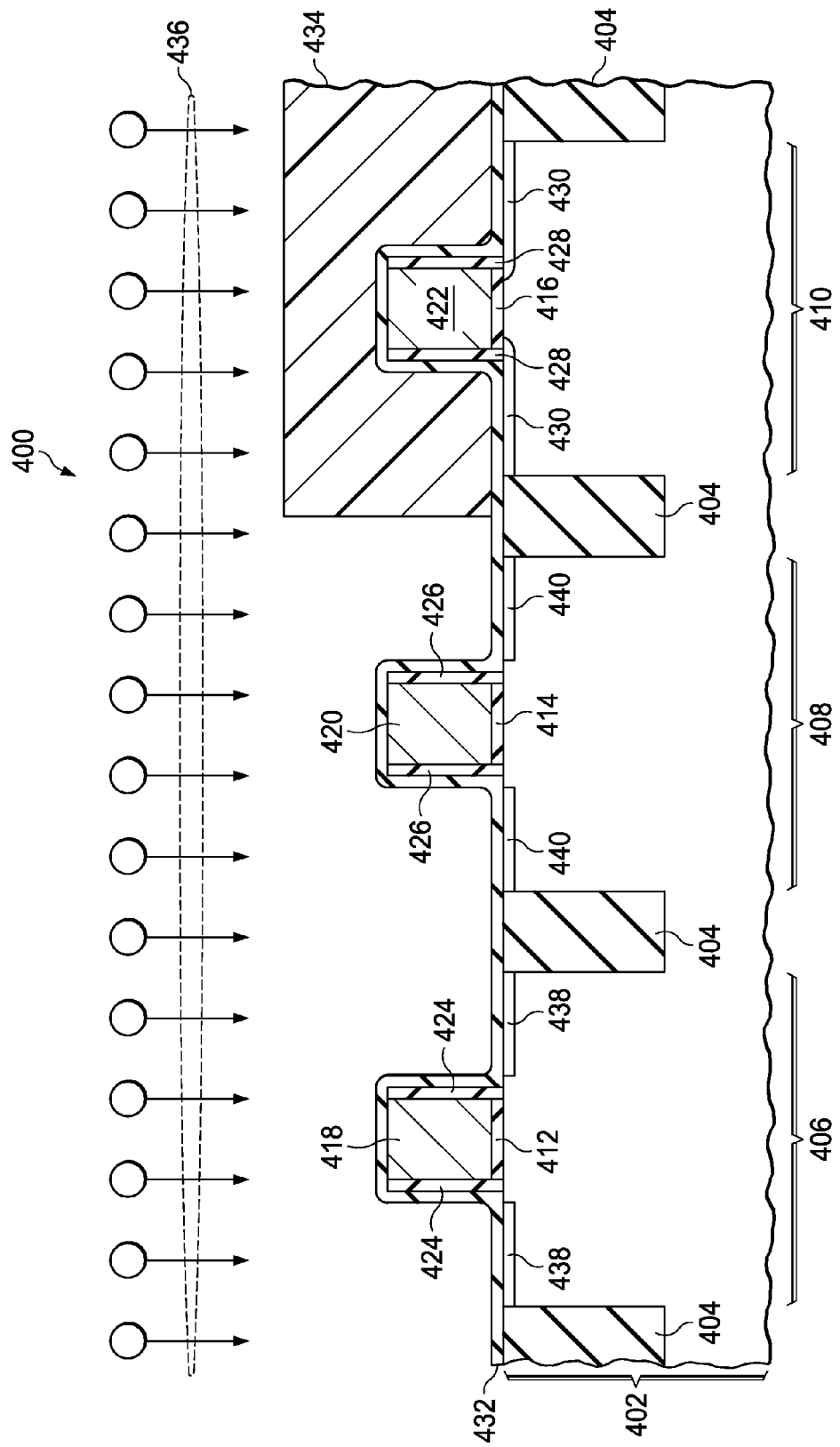
FIG. 4A through FIG. 4E are cross sections of an integrated circuit containing two transistors of a same polarity with epitaxial source/drain layers formed according to another example, depicted in successive stages of fabrication.

FIG. 4A through FIG. 4E are cross sections of an integrated circuit containing two transistors of a same polarity with epitaxial source/drain layers formed according to another example, depicted in successive stages of fabrication. Referring to FIG. 4A, the integrated circuit 400 is formed in an on a semiconductor substrate 402 for example as described in reference to FIG. 1A. Elements of field oxide 404 may be formed at a top surface of the substrate 402. The integrated circuit 400 includes a first area defined for a first transistor 406 having the first polarity, a second area defined for a second transistor 408 having the first polarity, and a third area defined for a third transistor 410 having the second polarity. In one version of the instant example, the first polarity may be p-channel and the second polarity may be n-channel. In another version, the first polarity may be n-channel and the second polarity may be p-channel.

A first gate dielectric layer 412 is formed on the substrate 402 in the area for the first transistor 406, a second gate dielectric layer 414 is formed on the substrate 402 in the area for the second transistor 408, and a third gate dielectric layer 416 is formed on the substrate 402 in the area for the third transistor 410, for example as described in reference to FIG. 1A. A first gate 418 is formed on the first gate dielectric layer 412, a second gate 420 is formed on the second gate dielectric layer 414, and a third gate 422 is formed on the third gate dielectric layer 416, for example as described in reference to FIG. 1A. Optional first gate offset spacers 424 may be formed on lateral surfaces of the first gate 418, optional second gate offset spacers 426 may be formed on lateral surfaces of the second gate 420, and/or optional third gate offset spacers 428 may be formed on lateral surfaces of the third gate 422, for example as described in reference to FIG. 1A. Third transistor LDD regions 430 having the second conductivity type are formed in the substrate 402 adjacent to the third gate 422, for example as described in reference to FIG. 1A and FIG. 1B.

A conformal epitaxial spacer layer 432 is formed over the integrated circuit 400, for example as described in reference to FIG. 1B. A first transistor LDD implant mask 434 is formed over the area for the third transistor 410 so as to expose the area for the first transistor 406 and the area for the second transistor 408. The first transistor LDD implant mask 434 may be formed as described in reference to the third transistor LDD implant mask 130 of FIG. 1A.

A first transistor LDD ion implant process is performed which implants first transistor LDD dopants 436 through the epitaxial spacer layer 432 into the substrate 402 adjacent to the first gate 418 and the second gate 420 to form first transistor LDD implanted regions 438 and second transistor LDD implanted regions 440, respectively, of the first conductivity type. A dose of the first transistor LDD dopants 436 may be, for example, in the range described in reference to the first transistor LDD dopants 144 of FIG. 1D. The dose of the first transistor LDD ion implant process may be adjusted to attain a desired amount of the first transistor LDD dopants 436 in the substrate 402 after a portion of the first transistor LDD dopants 436 are absorbed by the epitaxial spacer layer 432.

Figure 4B:
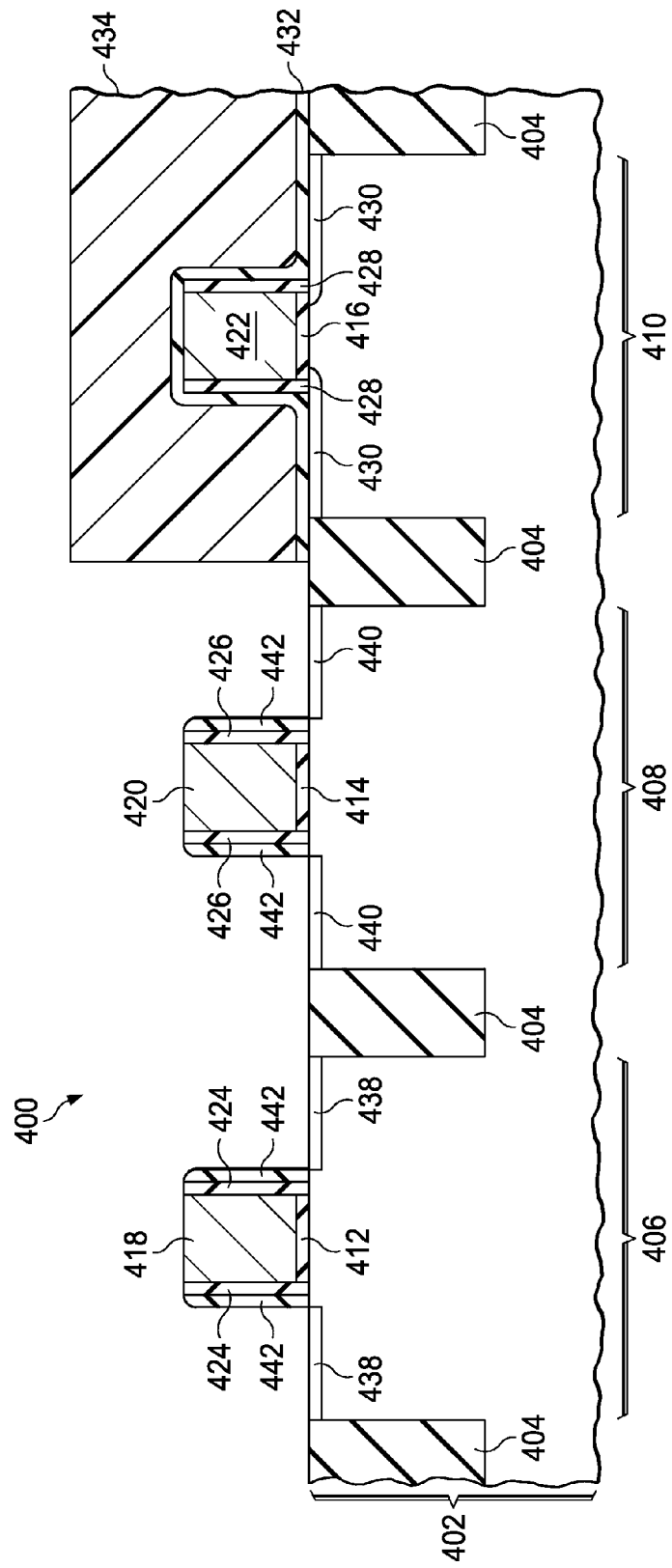

Referring to FIG. 4B, an epitaxial spacer anisotropic etch process is performed which removes material of the epitaxial spacer layer 432 from horizontal surfaces on the substrate 402, the first gate 418 and the second gate 420 so as to leave epitaxial spacers 442 adjacent to the first gate 418 and the second gate 420; on vertical surfaces of the first gate offset spacers 424 and the second gate offset spacers 426 if present, or on vertical surfaces of the first gate 418 and the second gate 420 if the first gate offset spacers 424 and second gate offset spacers 426 are not present, for example as described in reference to FIG. 1C. The first transistor LDD implant mask 434 is removed after the epitaxial spacer anisotropic etch process is completed, for example as described in reference to the third transistor LDD implant mask 130.

Figure 4C:
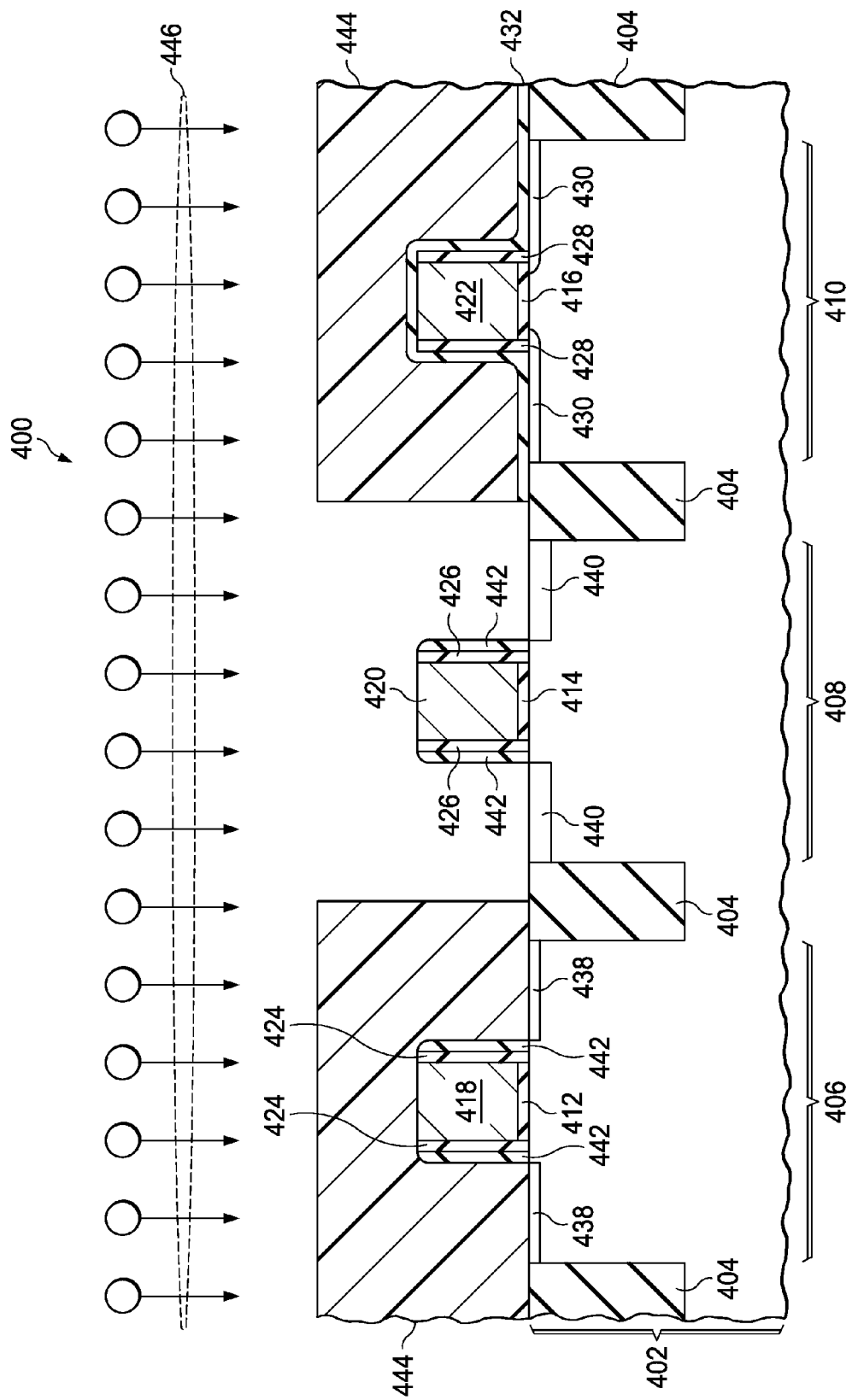

Referring to FIG. 4C, a second transistor LDD implant mask 444 is formed over the area for the first transistor 406 and the area for the third transistor 410 so as to expose the area for the second transistor 408. The second transistor LDD implant mask 444 may be formed as described in reference to the third transistor LDD implant mask 130 of FIG. 1A. A second transistor LDD ion implant process is performed which implants second transistor LDD dopants 446 into the substrate 402 adjacent to the second gate 420 to augment the second transistor LDD implanted regions 440. A dose of the second transistor LDD dopants 446 may be, for example, between $1 \times 10^{13}$ cm$^{-2}$ and $5 \times 10^{14}$ cm$^2$.

Figure 4D:
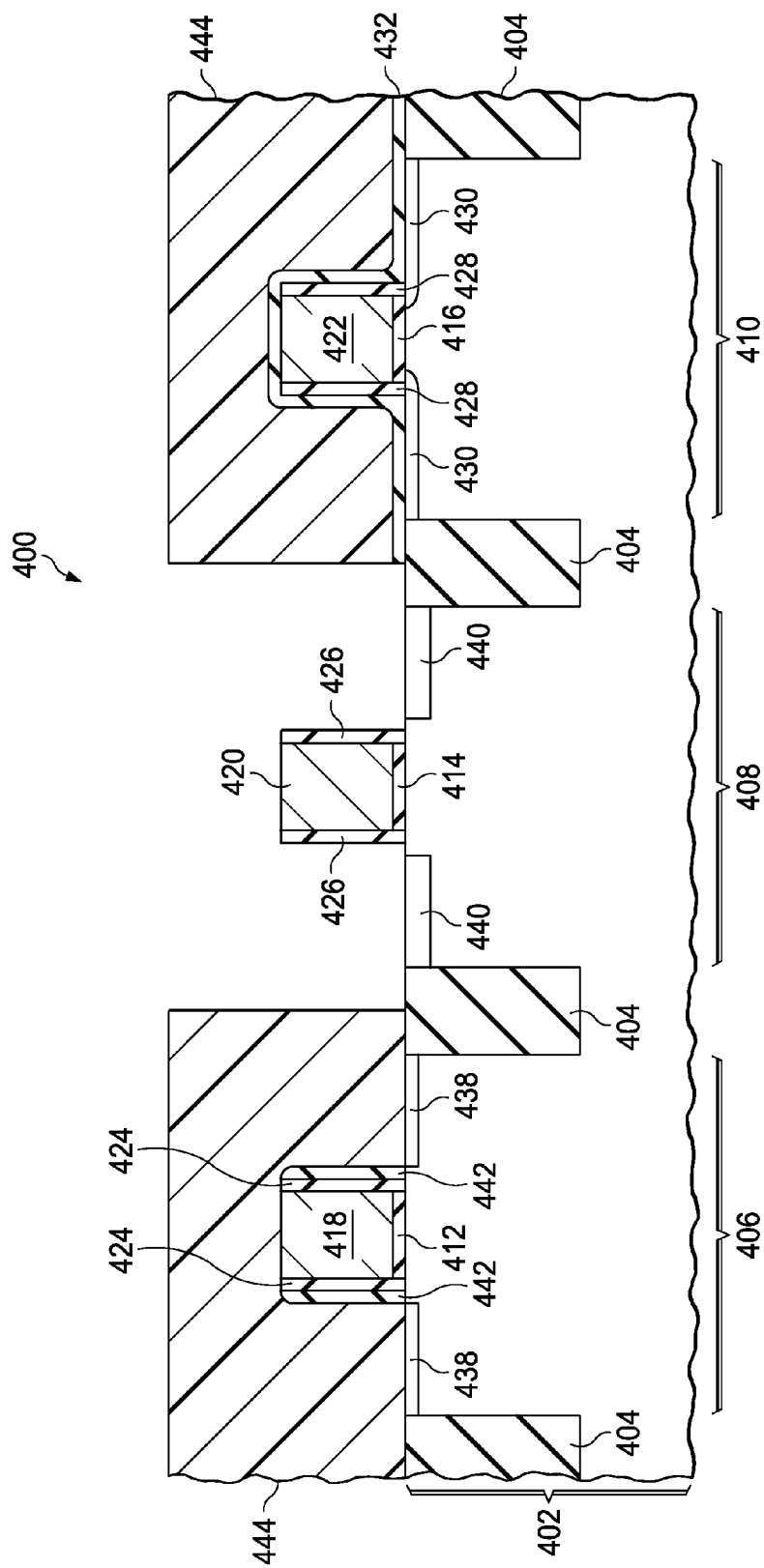

Referring to FIG. 4D, an epitaxial spacer layer etch process is performed which removes substantially all of the epitaxial spacer 442 in the area for the second transistor 408 exposed by the second transistor LDD implant mask 444, for example as described in reference to FIG. 1F. The second transistor LDD implant mask 444 is removed after the epitaxial spacer layer etch process is completed, for example as described in reference to the third transistor LDD implant mask 130.

Figure 4E:
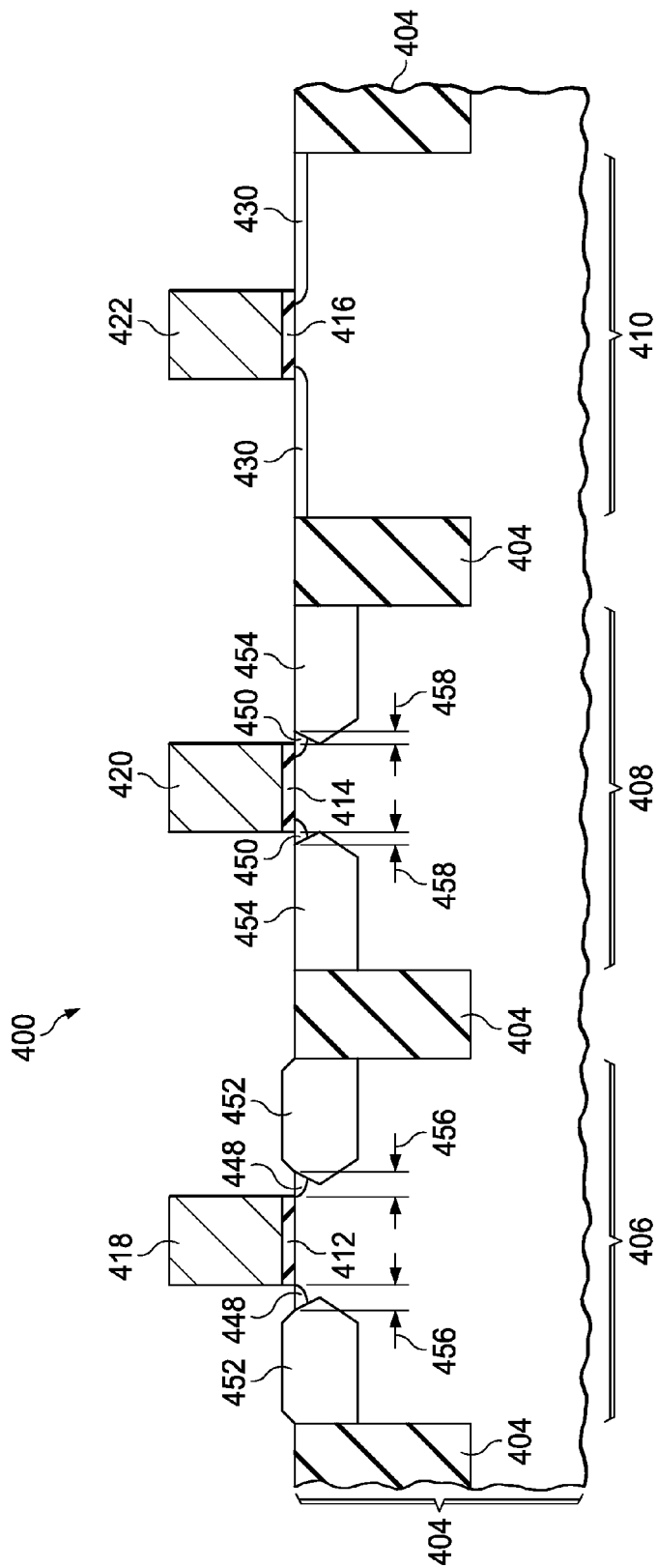

Referring to FIG. 4E, dopants in the first transistor LDD implanted regions 438 of FIG. 4A are activated to form first transistor LDD regions 448, and dopants in the second transistor LDD implanted regions 440 of FIG. 4C are activated to form second transistor LDD regions 450. First epitaxial source/drain regions 452 are formed adjacent to the first gate 418 and second epitaxial source/drain regions 454 are formed adjacent to the second gate 420, for example as described in reference to FIG. 1H through FIG. 1K. Due to the presence of the epitaxial spacers 442 adjacent to the first gate 418, the first epitaxial source/drain regions 452 are separated from the first gate 418 at the top surface of the substrate 402 by a first lateral space 456 on each side of the first gate 418 that is greater by at least 2 nanometers than a second lateral space 458 on each side of the second gate 420 which separates the second epitaxial source/drain regions 454 from the second gate 420 at the top surface of the substrate 402. In one version of the instant example, the first lateral space 456 is larger than the second lateral space 458 by 2 to 5 nanometers. In one version of the instant example, the first epitaxial source/drain regions 452 may be thicker than the second epitaxial source/drain regions 454 by 2 to 5 nanometers.

In one version of the instant example, the first transistor 406 and the second transistor 408 may be p-channel, and the first epitaxial source/drain regions 452 and the second epitaxial source/drain regions 454 may include silicon germanium (SiGe) semiconductor material as described in reference to FIG. 1L. Furthermore in this version, the first transistor 406 may be part of an SRAM cell and the second transistor 408 may be part of a logic gate. In another version of the instant example, the first transistor 406 and the second transistor 408 may be n-channel, and the first epitaxial source/drain regions 452 and the second epitaxial source/drain regions 454 may include silicon carbide (SiC) semiconductor material as described in reference to FIG. 1L. Furthermore in this version, the first transistor 406 may be part of a logic gate and the second transistor 408 may be part of an SRAM cell.

Figure 5:
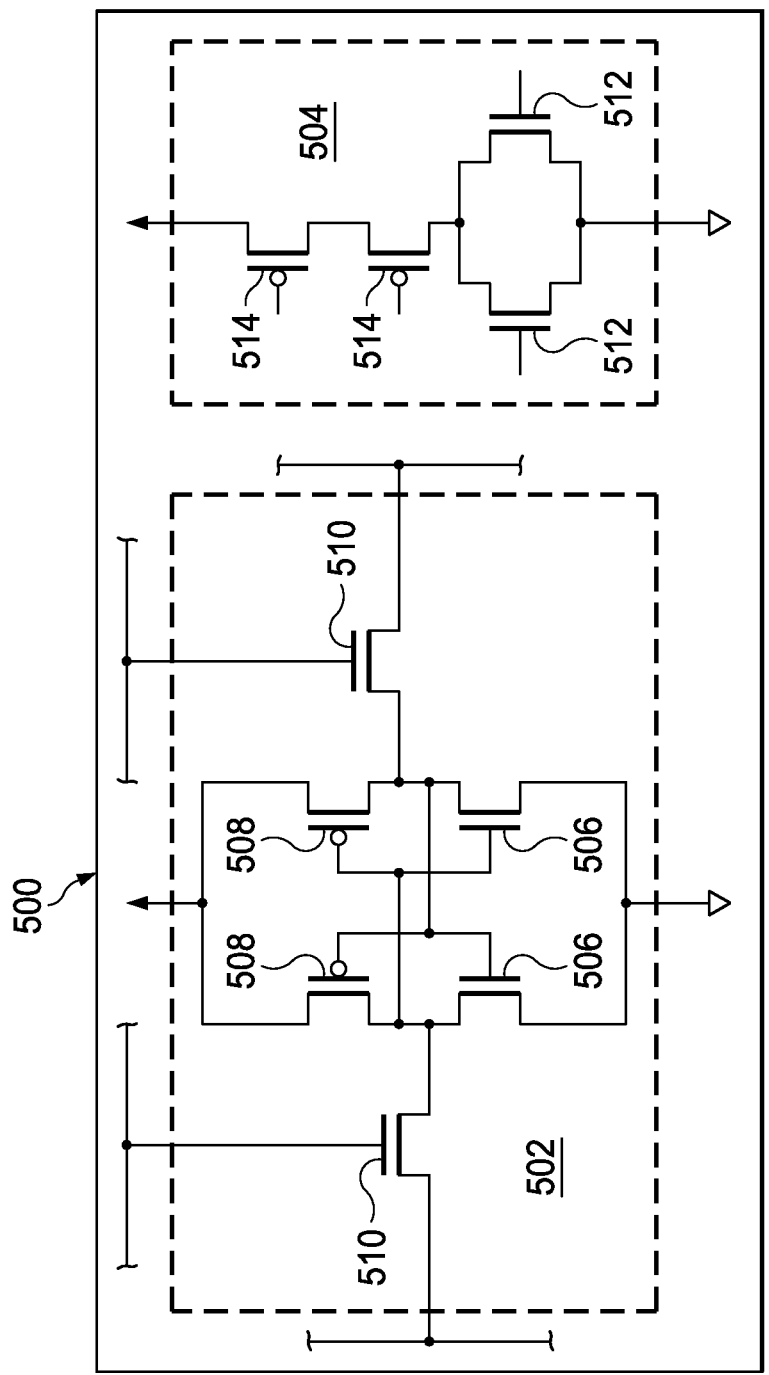
FIG. 5 is a schematic diagram of an integrated circuit containing transistors formed according to an example.

FIG. 5 is a schematic diagram of an integrated circuit containing transistors formed according to an example. The integrated circuit 500 includes an SRAM cell 502 and a logic gate 504. The SRAM cell 502 includes n-channel driver transistors 506, p-channel load transistors 508 and n-channel passgate transistors 510. The logic gate 504 includes n-channel pull-down transistors 512 and p-channel pull-up transistors 514.

In one version of the instant example, the p-channel SRAM load transistors 508 and the p-channel logic gate pull-up transistors 514 may be formed so as to have SiGe epitaxial source/drain regions, in which epitaxial spacers are formed adjacent to gates of the SRAM load transistors 508, so that the SRAM load transistor epitaxial source/drain regions are separated from the SRAM load transistor gates by a lateral space which is greater by at least 2 nanometers than a similar lateral space separating the logic gate pull-up transistor epitaxial source/drain regions from the logic gate pull-up transistor gates.

In another version of the instant example, the n-channel SRAM driver transistors 506 and the n-channel logic gate pull-down transistors 512 may be formed so as to have SiC epitaxial source/drain regions, in which epitaxial spacers are formed adjacent to gates of the SRAM driver transistors 506, so that the SRAM driver transistor epitaxial source/drain regions are separated from the SRAM driver transistor gates by a lateral space which is greater by at least 2 nanometers than a similar lateral space separating the logic gate pull-down transistor epitaxial source/drain regions from the logic gate pull-down transistor gates.

What is claimed is:

1. A method of forming an integrated circuit, comprising the steps of:
    forming a first gate on a substrate in an area defined for a first transistor, the first transistor having a first polarity;
    forming a second gate on the substrate in an area defined for a second transistor, the second transistor having the first polarity;
    forming a third gate on the substrate in an area defined for a third transistor, the third transistor having a second polarity opposite from the first polarity;
    forming a conformal epitaxial spacer layer over the substrate;
    performing a first transistor LDD ion implant process which implants first transistor LDD dopants into the substrate adjacent to the first gate to form first transistor LDD implanted regions of a first conductivity type;
    performing an epitaxial spacer anisotropic etch process which removes material of the epitaxial spacer layer from horizontal surfaces on the substrate and the first gate so as to leave epitaxial spacers on vertical surfaces adjacent to the first gate, the epitaxial spacers being at least 2 nanometer thick;
    performing an epitaxial spacer layer etch process which removes substantially all of the epitaxial spacer layer in the area for the second transistor but not in the area for the first transistor;
    forming an epitaxial blocking layer over the integrated circuit;
    performing an epitaxial blocking layer etch process which removes material from the epitaxial blocking layer in the area for the first transistor and the area for the second transistor;
    with the epitaxial spacers on the vertical surfaces adjacent the first gate but not adjacent the second gate, performing a source/drain etch process which removes material from the substrate in source and drain regions of the area for the first transistor and the area for the second transistor, so as to form first source/drain etched regions adjacent to the first gate and second source/drain etched regions adjacent to the second gate; and
    performing a source/drain epitaxial process which grows source/drain epitaxial material in the first source/drain etched regions and in the second source/drain etched regions to form first epitaxial source/drain regions adjacent to the first gate and second epitaxial source/drain regions adjacent to the second gate, respectively, such that the first epitaxial source/drain regions are separated from the first gate at a top surface of the substrate by a first lateral space on each side of the first gate that is greater by at least 2 nanometers than a second lateral space on each side of the second gate which separates the second epitaxial source/drain regions from the second gate at the top surface of the substrate.

2. The method of claim 1, wherein source/drain etch process is performed so that the second source/drain etched regions extend deeper into the substrate than the first source/drain etched regions by at least 2 nanometers.

3. The method of claim 1, wherein the source/drain epitaxial process is performed so that the first epitaxial source/drain regions are thicker than the second epitaxial source/drain regions by at least 2 nanometers.

4. The method of claim 1, wherein:
the first polarity is p-channel;
the second polarity is n-channel; and
the source/drain epitaxial material includes silicon germanium.

5. The method of claim 4, wherein:
the first transistor is part of a static random access memory (SRAM) cell; and
the second transistor is part of a logic gate.

6. The method of claim 1, wherein:
the first polarity is n-channel;
the second polarity is p-channel; and
the source/drain epitaxial material includes silicon carbide.

7. The method of claim 6, wherein:
the first transistor is part of an SRAM cell; and
the second transistor is part of a logic gate.

8. The method of claim 1, wherein the epitaxial spacer anisotropic etch process is performed on the epitaxial spacer layer in the area for the second transistor so as to form epitaxial spacers adjacent to the second gate, prior to the step of performing the epitaxial spacer layer etch process.

9. The method of claim 1, wherein the first transistor LDD ion implant process concurrently forms second transistor LDD implanted regions in the substrate adjacent to the second gate.

10. The method of claim 1, further including the steps of:
forming a first transistor LDD implant mask over the area for the third transistor so as to expose the area for the first transistor, prior to the first transistor LDD ion implant process and the epitaxial spacer anisotropic etch process; and
removing the first transistor LDD implant mask after the first transistor LDD ion implant process and the epitaxial spacer anisotropic etch process are both completed.

11. The method of claim 1, further including the steps of:
forming a second transistor LDD implant mask over the area for the third transistor so as to expose the area for the second transistor, prior to the epitaxial spacer etch process;
performing a second transistor LDD ion implant process which implants second transistor LDD dopants into the substrate adjacent to the second gate to form second transistor LDD implanted regions of the first conductivity type, after the second transistor LDD implant mask is formed; and
removing the second transistor LDD implant mask after the second transistor LDD ion implant process and the epitaxial spacer etch process are both completed.

12. The method of claim 1, wherein the first transistor LDD ion implant process is performed after the step of forming the conformal epitaxial spacer layer and before the epitaxial spacer anisotropic etch process, so that the first transistor LDD dopants are implanted through the conformal epitaxial spacer layer into the substrate.

13. The method of claim 1, wherein the epitaxial spacer anisotropic etch process is performed before the first transistor LDD ion implant process.

14. The method of claim 1, wherein the epitaxial spacer etch process is performed before a second transistor LDD ion implant process.

15. A method of forming an integrated circuit, comprising the steps of:
forming a first gate on a substrate in an area defined for a first transistor, the first transistor having a first polarity;
forming a second gate on the substrate in an area defined for a second transistor, the second transistor having the first polarity;
forming a third gate on the substrate in an area defined for a third transistor, the third transistor having a second polarity opposite from the first polarity;
forming offset spacers adjacent the first gate, the second gate, and the third gate;
forming a conformal epitaxial spacer layer over the substrate including over the offset spacers;
performing a first transistor LDD ion implant process which implants first transistor LDD dopants into the substrate adjacent to the first gate to form first transistor LDD implanted regions of a first conductivity type;
forming a first implant mask that covers the area for the third transistor and exposes the area for the first transistor;
using the first implant mask, performing an epitaxial spacer anisotropic etch process which removes material of the epitaxial spacer layer from horizontal surfaces on the substrate and the first gate to form epitaxial spacers on vertical surfaces adjacent to the first gate;
removing the first implant mask;
forming a second implant mask that covers the area for the first transistor and the area for the third transistor and exposes the area for the second transistor;
using the second implant mask, performing an epitaxial spacer layer etch process which removes substantially all of the epitaxial spacer layer in the area for the second transistor while leaving the epitaxial spacers in the area for the first transistor;
forming an epitaxial blocking layer over the integrated circuit;
performing an epitaxial blocking layer etch process which removes material from the epitaxial blocking layer in the area for the first transistor and the area for the second transistor;
with the epitaxial spacers on the vertical surfaces adjacent the first gate and the epitaxial spacer layer removed in the area of the second transistor, performing a source/drain etch process which removes material from the substrate in source and drain regions of the area for the first transistor and the area for the second transistor; and
performing a source/drain epitaxial process which grows source/drain epitaxial material in the source and drain regions of the area for the first transistor and the area of the second transistor.

16. The method of claim 15, wherein the performing a first transistor LDD ion implant process implants first transistor LDD dopants through the epitaxial spacer layer.

17. The method of claim 16, further comprising performing a second transistor LDD ion implant process to implant second transistor LDD dopants through the epitaxial spacer layer.

18. The method of claim 15, wherein the performing a first transistor LDD ion implant process implants first transistor LDD dopants adjacent the epitaxial spacers in the area of the first transistor.

19. The method of claim 18, wherein the first implant mask exposes the area for the second transistor and the epitaxial spacers are also formed adjacent the second gate and further comprising performing a second transistor LDD ion implant process to implant second transistor LDD dopants adjacent the epitaxial spacers in the area of the second transistor.

* * * * *